(12) United States Patent
Ching et al.

(10) Patent No.: US 10,497,778 B2
(45) Date of Patent: Dec. 3, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuo-Cheng Ching, Hsinchu County (TW); Ching-Wei Tsai, Hsinchu (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/053,589

(22) Filed: Aug. 2, 2018

(65) Prior Publication Data

US 2019/0165094 A1 May 30, 2019

Related U.S. Application Data

(60) Provisional application No. 62/592,912, filed on Nov. 30, 2017.

(51) Int. Cl.
*H01L 21/762* (2006.01)
*H01L 29/06* (2006.01)
*H01L 29/417* (2006.01)
*H01L 29/78* (2006.01)
*H01L 29/66* (2006.01)

(52) U.S. Cl.
CPC .... *H01L 29/0649* (2013.01); *H01L 29/41791* (2013.01); *H01L 29/66795* (2013.01); *H01L 29/785* (2013.01); *H01L 2029/7858* (2013.01)

(58) Field of Classification Search
CPC ........... H01L 27/0924; H01L 21/76224; H01L 29/0603; H01L 21/823431; H01L 21/823821; H01L 27/0886
See application file for complete search history.

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,590,074 B1 * | 3/2017 | Pranatharthiharan | H01L 21/823878 |

(Continued)

OTHER PUBLICATIONS

Xie et al., "A 7nm FinFET technology featuring EUV patterning and dual strained high mobility channels", Electron Devices Meeting (IEDM), IEEE, Dec. 3, 2016.

*Primary Examiner* — George R Fourson, III
(74) *Attorney, Agent, or Firm* — Maschoff Brennan

(57) ABSTRACT

A semiconductor device includes a substrate, a semiconductor fin, an isolation plug, and an isolation structure. The semiconductor fin is over the substrate. The isolation plug is over the substrate and adjacent to an end of the semiconductor fin. The isolation structure is over the substrate and adjacent to sidewalls of the semiconductor fin and the isolation plug. A top surface of the isolation structure is in a position lower than a top surface of the isolation plug.

20 Claims, 25 Drawing Sheets

(56) References Cited

U.S. PATENT DOCUMENTS

| | | |
|---|---|---|
| 9,608,116 B2 | 3/2017 | Ching et al. |
| 9,741,823 B1 * | 8/2017 | Greene ............. H01L 29/66545 |
| 9,768,072 B1 * | 9/2017 | Cheng ............. H01L 21/823487 |
| 9,812,363 B1 | 11/2017 | Liao et al. |
| 9,842,931 B1 * | 12/2017 | Anderson ............. H01L 29/785 |
| 9,859,380 B2 | 1/2018 | Lee et al. |
| 10,008,599 B1 * | 6/2018 | Hsu ..................... H01L 29/7846 |
| 10,074,571 B1 * | 9/2018 | Greene ............ H01L 21/823481 |
| 2014/0003133 A1 * | 1/2014 | Lin ....................... G11C 11/419 |
| | | 365/154 |
| 2016/0111336 A1 * | 4/2016 | Chang ............. H01L 21/823481 |
| | | 257/401 |
| 2016/0379886 A1 * | 12/2016 | Kim ................ H01L 21/823431 |
| | | 438/283 |
| 2017/0040162 A1 * | 2/2017 | Smith ................. H01L 21/0274 |
| 2017/0194436 A1 * | 7/2017 | Basker ................ H01L 29/0657 |
| 2017/0358660 A1 * | 12/2017 | Cheng ............. H01L 29/66666 |
| 2018/0047845 A1 * | 2/2018 | Cheng ................. H01L 29/7848 |
| 2018/0090491 A1 * | 3/2018 | Huang ............... H01L 21/76224 |
| 2018/0261514 A1 * | 9/2018 | Xie .................... H01L 29/66545 |
| 2019/0067446 A1 * | 2/2019 | Ching ............... H01L 29/6681 |
| 2019/0096769 A1 * | 3/2019 | Ching ............... H01L 21/76202 |

\* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/592,912, filed Nov. 30, 2017, which is herein incorporated by reference.

BACKGROUND

The semiconductor industry has progressed into nanometer technology process nodes in pursuit of higher device density, higher performance, and lower cost. In the course of integrated circuit (IC) evolution, functional density (i.e., the number of interconnected devices per chip area) has increased while geometry size (i.e., the smallest component (or line) that can be created using a fabrication process) has decreased. This scaling down process increases production efficiency and lowers associated costs. Such scaling down has also increased the complexity of processing and manufacturing ICs, and, for these advances to be realized, similar developments in IC manufacturing are desired. For example, novel semiconductor materials, including compound semiconductors, are being investigated to supplement or replace conventional silicon substrates. While these alternative semiconductor materials often possess superior electrical characteristics, just as often they possess their own sets of challenges. Accordingly, this transition to more exacting materials is one of the drivers of new fabrication processes. Therefore, although existing semiconductor fabrication process have been adequate, they have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
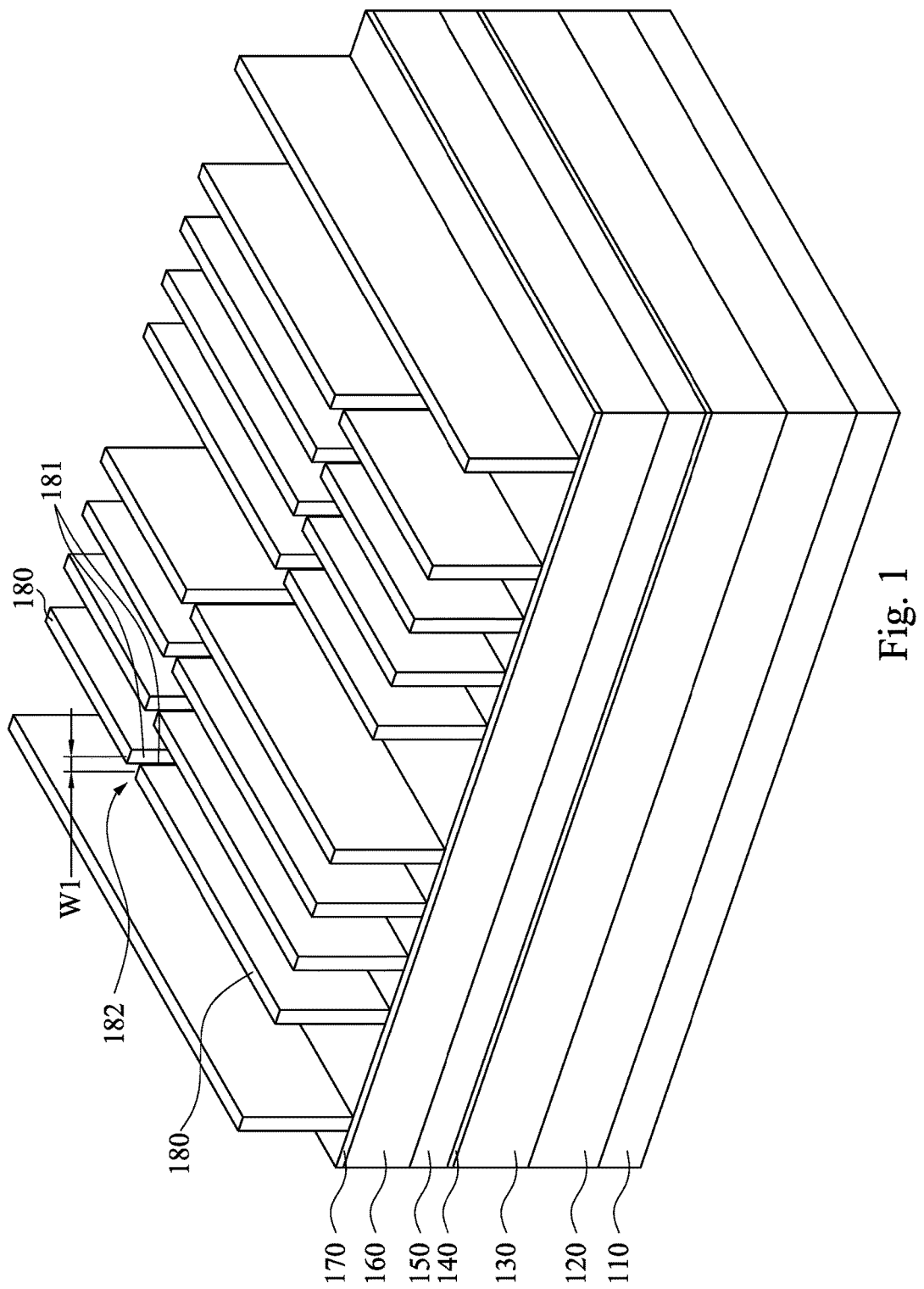
FIGS. 1, 2A, 2B, 3A, 3B, 4, 5A, 6, 7A, 8, 9A, 10, 11A, and 12A are perspective views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1, 2A, 2B, 3A, 3B, 4, 5A, 6, 7A, 8, 9A, 10, 11A, and 12A are perspective views of a method for manufacturing a semiconductor device at various stages in accordance with some embodiments of the present disclosure. In some embodiments, the semiconductor device shown in FIGS. 1, 2A, 2B, 3A, 3B, 4, 5A, 6, 7A, 8, 9A, 10, 11A, and 12A may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110 is provided. In some embodiments, the substrate 110 may include silicon (Si). Alternatively, the substrate 110 may include germanium (Ge), silicon germanium, gallium arsenide (GaAs), or other appropriate semiconductor materials. In some alternative embodiments, the substrate 110 may include an epitaxial layer. Furthermore, the substrate 110 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

A buffer layer 120 is formed over the substrate 110. The buffer layer 120 and the substrate 110 are made of different materials. In some embodiments, the buffer layer 120 includes an epitaxially grown layer. The epitaxially grown layer may include III-V group compound semiconductor materials, SiGe and/or other suitable materials. In some embodiments, the buffer layer 120 is in contact with the substrate 110. In some embodiments, the thickness of the buffer layer 120 is in a range from about 20 nm to about 60 nm, and if the buffer layer 120 is made of SiGe, the germanium percentage (atomic percentage) of the buffer layer 120 is in a range from about 25 percent to about 60 percent, while higher or lower germanium percentages may be used. With such configuration, the lattice constant of the buffer layer 120 is similar to or substantially the same as the lattice constant of the substrate 110, and thus the defect issue on the top surface of the buffer layer 120, which is caused by lattice relaxation of thicker buffer layer, can be improved. The term "substantially" as used herein may be applied to modify any quantitative representation which could permissibly vary without resulting in a change in the basic function to which it is related.

A channel layer 130 is formed over the buffer layer 120. The channel layer 130 may include an epitaxially grown layer. The channel layer 130 may be a pure silicon layer that is substantially free from germanium. The channel layer 130 may also be substantially pure silicon layers, for example, with a germanium percentage lower than about 1 percent. As mentioned above, since the defect issue of the buffer layer 120 is improved, the epitaxial quality of the channel layer 130 can be improved as well.

A pad layer 140 and a mask layer 150 are formed over the channel layer 130. The pad layer 140 includes a dielectric material, such as silicon oxide, silicon nitride, silicon oxynitride, or any other suitable dielectric material. The mask layer 150 includes a dielectric material, such as silicon oxide, silicon nitride, silicon oxynitride, or any other suitable dielectric material. In some embodiments, the mask layer 150 is a hard mask layer. In some embodiments, the pad layer 140 is a silicon oxide layer deposited over the channel layer 130, and the mask layer 150 is a silicon nitride layer deposited over the pad layer 140. The pad layer 140 and the mask layer 150 can be formed by thermal oxidation, chemical oxidation, atomic layer deposition (ALD), chemical vapor deposition (CVD), or any other appropriate method. In some embodiments, the thickness of the pad layer 140 may be in a range from about 10 nm to about 80 nm, and the thickness of the mask layer 150 may be in a range from about 20 nm to about 200 nm.

A transfer layer 160 is formed over the mask layer 150. In some embodiments, the transfer layer 160 includes a dielectric material, such as silicon oxide, silicon nitride, silicon oxynitride, or any other suitable dielectric material. The transfer layer 160 is used to transfer the pattern of first mask patterns 180 (formed over the transfer layer 160) to the mask layer 150 in the following process.

An etch stop layer 170 is formed over the transfer layer 160. The etch stop layer 170 may be a masking material such as silicon oxynitride, although other suitable materials, such as silicon oxide or silicon nitride, may alternatively be utilized, and may be formed by a process such as atomic layer deposition (ALD). However, any other suitable processes and thicknesses may alternatively be utilized.

A plurality of first mask patterns 180 are formed over the etch stop layer 170. In some embodiments, the first mask patterns 180 may be formed of SiN, AlO, AlON, TaN, TiN, TiO, or SiO, although other materials such as nitrides, oxides, oxynitrides, carbides, borides, combinations thereof, or the like, could alternatively be used. In some embodiments, a patterned layer (not shown) can be formed over the etch stop layer 170, and a blanketing mask layer (not shown) is conformally formed over the patterned layer. The blanketing mask layer is then etched to remove portions of the blanketing mask layer from the topmost surface of the patterned layer and the top surface of the etch stop layer 170. Portions of the blanketing mask layer remaining on the sidewalls of the patterned layer forms the first mask patterns 180. The patterned layer is then removed. The blanketing mask layer may be formed using, for example, low pressure CVD (LPCVD), PVD, ALD, the like, or the combination thereof.

In FIG. 1, the first mask patterns 180 can be patterned according to layout design of the following formed semiconductor fins. For example, some of the first mask patterns 180 can be cut to form trenches 182 therebetween, and as a result of the formation of the trenches 182, there are end-to-end spacings between the first mask patterns 180. That is, one of the trenches 182 is formed between ends 181 of the first mask patterns 180, and the end 181 of one of the cut first mask patterns 180 opposes the end 181 of another of the cut first mask patterns 180 with the trench 182 being formed therebetween. In some other embodiments, however, the first mask patterns 180 may have different arrangements. The trenches 182 can be formed by, for example, performing a photolithography process and then an etching process. The photolithography process includes coating the first mask patterns 180 with a photoresist, selectively exposing the photoresist according to a desired pattern, developing the photoresist, and using the patterned photoresist as an etch mask. The etching process is then performed to the first mask patterns 180 upon which the patterned photoresist is utilized, thereby forming the trenches 182. The trench 182 has a width W1 in a range from about 30 nm to about 100 nm.

Figure 2A:
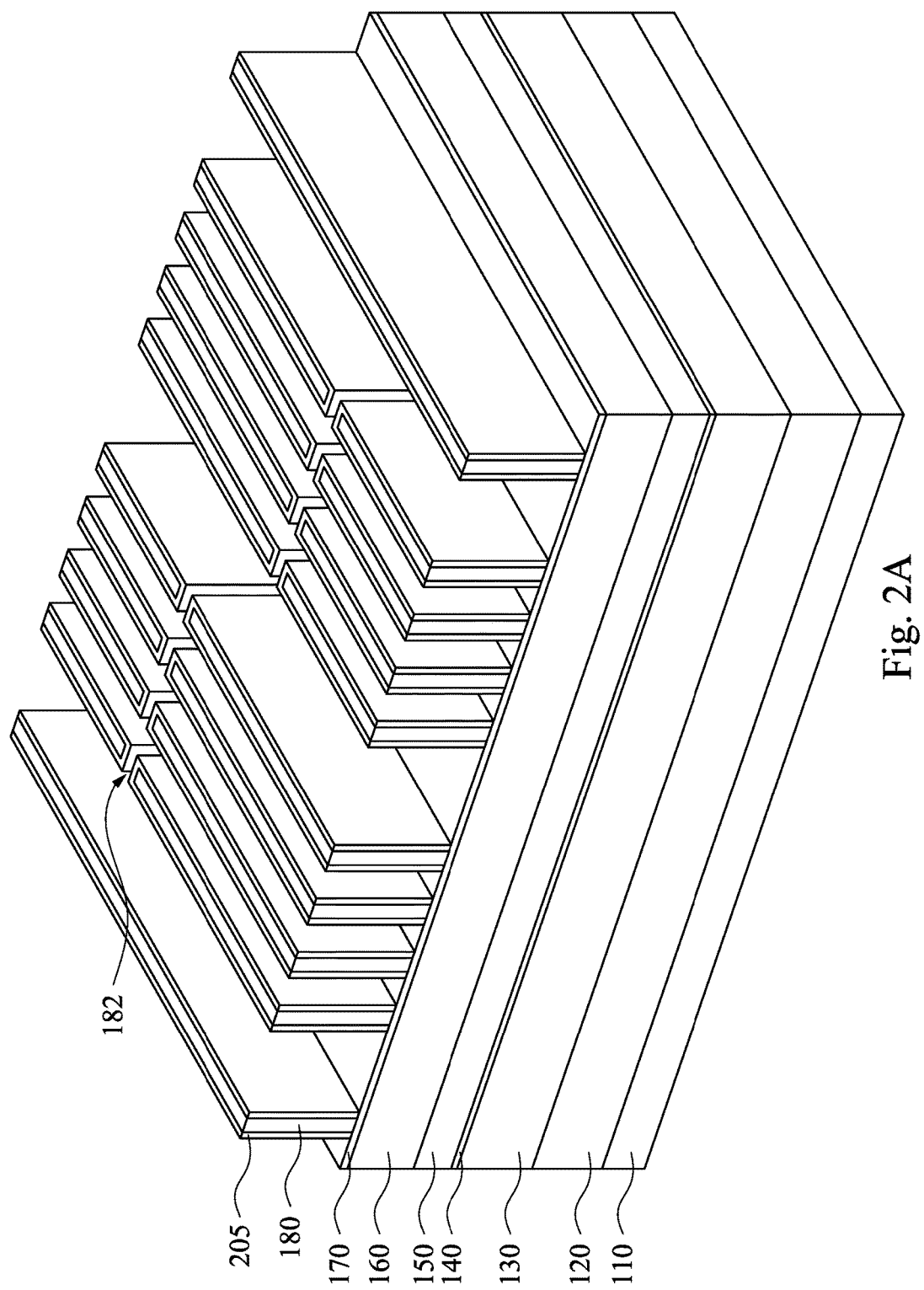
Figure 2B:
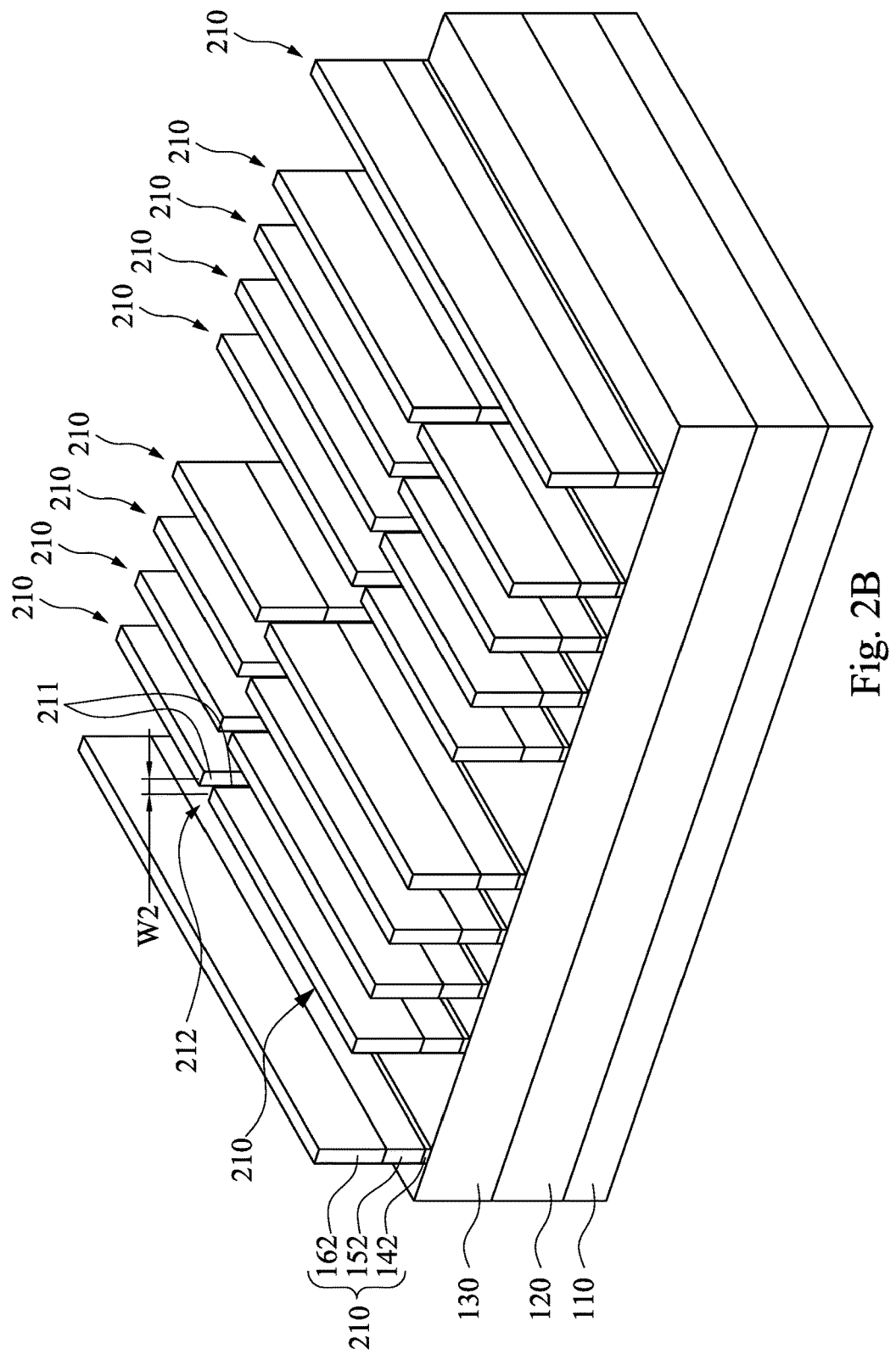

Reference is made to FIG. 2A-2B. A hard mask layer 205 is conformally formed over the first mask patterns 180 and then etching operations are performed to remove horizontal portions thereof in order to shrinkage the width W1 (see FIG. 1) of the trench 182. The hard mask layer 205 may include silicon nitride and/or other suitable materials. The hard mask layer 205 may be formed by CVD and/or ALD. The hard mask layer 205 may be formed by other suitable processes, such as PVD, PECVD, RTCVD, MOCVD, HPCVD, sputtering, plating, spin-on coating, other suitable processes, and/or combinations thereof.

The hard mask layer 205, the transfer layer 160, the mask layer 150, and the pad layer 140 (see FIG. 1) are patterned using the first mask patterns 180 as masks. The remaining portions of the transfer layer 162, the mask layer 152, and the pad layer 142 are referred to as second mask patterns 210. The transfer layer 160, the mask layer 150, and the pad layer 140 can be partially removed by performing multiple etching processes. After forming the second mask patterns 210, the hard mask layer 205, the first mask patterns 180 and the patterned etch stop layer 170 (see FIG. 1) are removed. Furthermore, the second mask patterns 210 can be cut to form trenches 212 therebetween, and as a result of the formation of the trenches 212, there are end-to-end spacings between the second mask patterns 210. That is, one of the trenches 212 is formed between ends 211 of the second mask patterns 210, and the end 211 of one of the cut second mask patterns 210 opposes the end 211 of another of the cut second mask patterns 210 with the trench 212 being formed therebetween. The trench 212 has a width W2 is in a range from about 30 nm to about 100 nm, in which the width W2 is smaller than the width W1 (see FIG. 1).

Figure 3A:
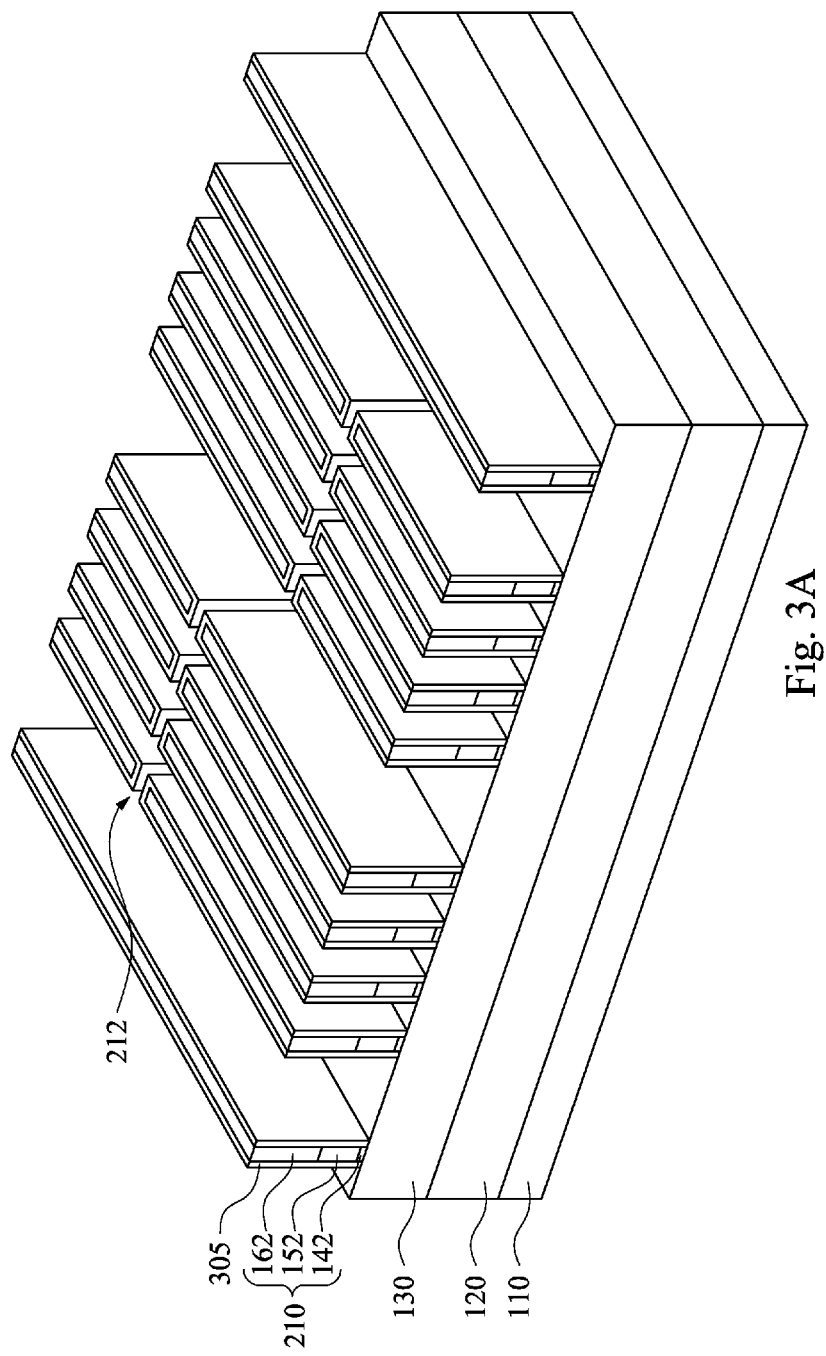
Figure 3B:
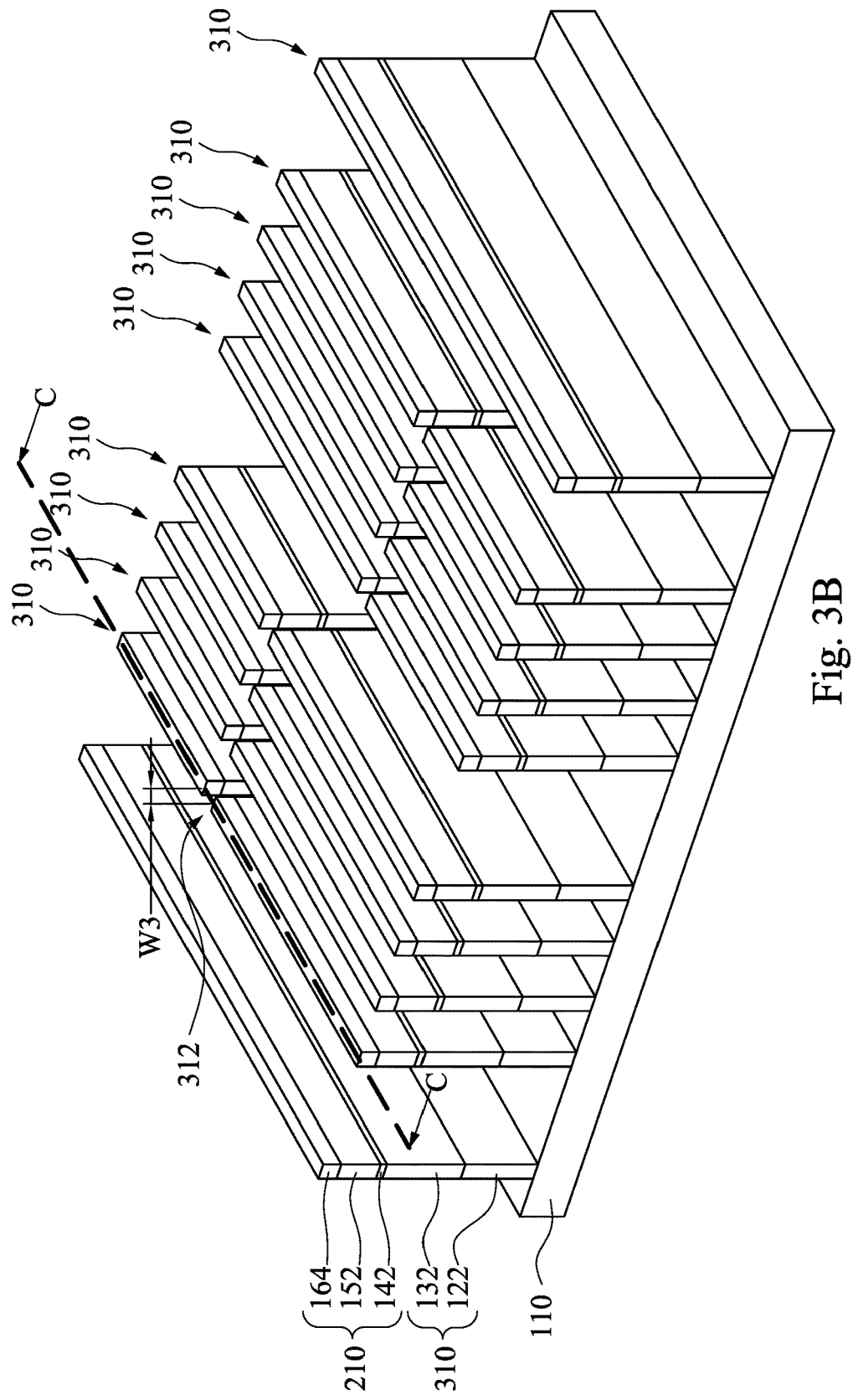
Figure 3C:
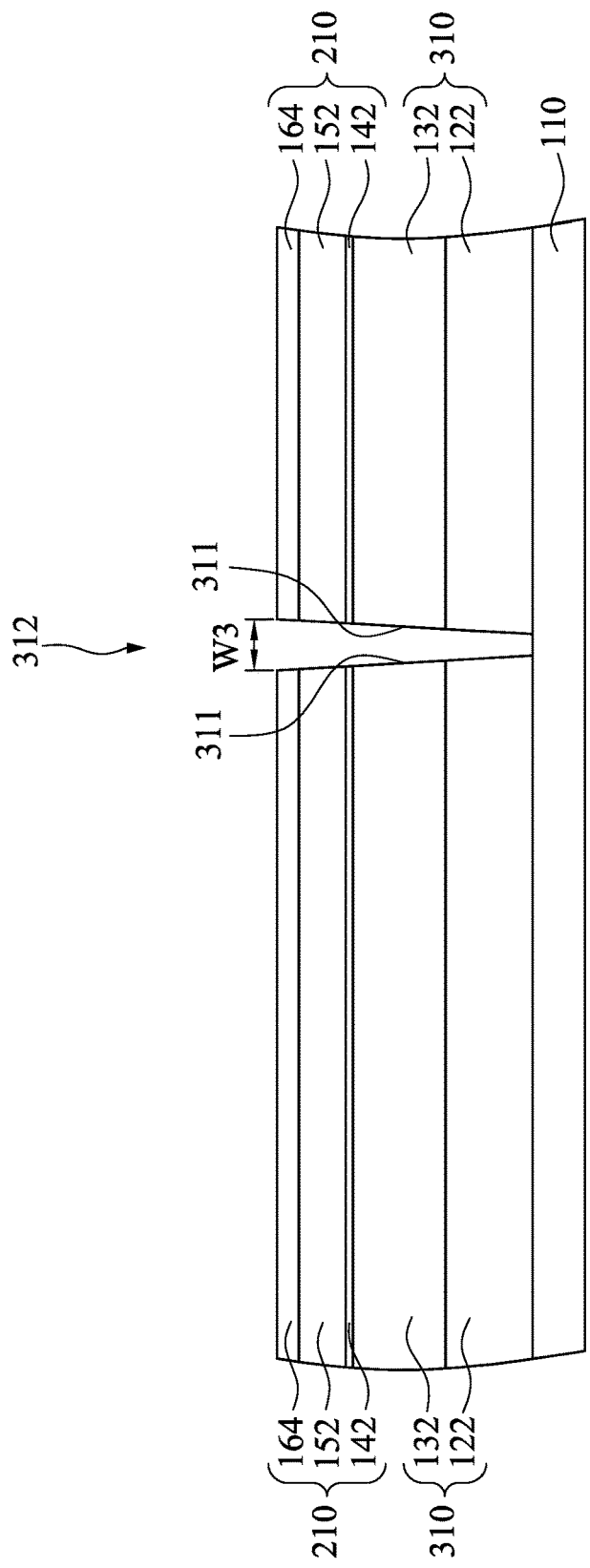
FIG. 3C is a cross-sectional view taken along line C-C of FIG. 3B.

Reference is made to FIG. 3A-3C. FIG. 3C is a cross-sectional view taken along line C-C of FIG. 3B. Another hard mask layer 305 is conformally formed over the second mask patterns 210 and then etching operations are performed to remove horizontal portions thereof in order to shrinkage the width W2 (see FIG. 2B) of the trench 212. The hard mask layer 305 may include silicon oxide and/or other suitable materials. The hard mask layer 305 may be formed by CVD and/or ALD. The hard mask layer 305 may be formed by other suitable processes, such as PVD, PECVD, RTCVD, MOCVD, HPCVD, sputtering, plating, spin-on coating, other suitable processes, and/or combinations thereof.

The hard mask layer 305, the buffer layer 120 and the channel layer 130 (see FIG. 2B) are patterned using the second mask patterns 210 (see FIG. 2B) as masks. Accordingly, a plurality of semiconductor fins 310 are formed respectively under the second mask patterns 210. The remaining portions of the buffer layer 122 and the channel layer 132 are referred to as the semiconductor fins 310. The buffer layer 120 and the channel layer 130 can be partially removed by performing single or multiple etching processes. During forming the semiconductor fins 310, the hard mask layer 305 is removed, and upper portions of the transfer layers 162 (see FIG. 2B) may be removed to form transfer layers 164. Some of the semiconductor fins 310 can be cut to form trenches 312 therebetween, and as a result of the formation of the trenches 312, there are end-to-end spacings between the semiconductor fins 310. That is, as shown in the partial cross-sectional view of FIG. 3C, one of the trenches 312 is formed between ends 311 of the semiconductor fins 310, and the end 311 of one of the cut semiconductor fins 310 opposes the end 311 of another of the cut semiconductor fins 310 with the trench 312 being formed therebetween. The trench 312 has a width W3 in a range from about 8 nm to about 15 nm, in which the width W3 is smaller than the width W2 (see FIG. 2B). Furthermore, as shown in FIG. 3C, the trench 312 tapers toward the substrate 110. In other words, the trench 312 gets narrower toward the substrate 110. Moreover, the trench 312 exposes the top surface of the substrate 110. That is, the trench 312 cut through the whole buffer layer 122. With this configuration, since the semiconductor fin 310 is cut by the trench 312, the stress in the buffer layer 122 is changed. For example, the lattice constant of the buffer layer 122 may get greater than that of the substrate 110 and the channel layer 132, and thus the buffer layer 122 affects the stress of the channel layer 132 disposed thereon. If the channel layer 132 is an n-type channel, the buffer layer 122 can enhance the strain in the channel layer 132 (adjacent to the trench 312) to improve the performance of the formed semiconductor device.

Figure 4:
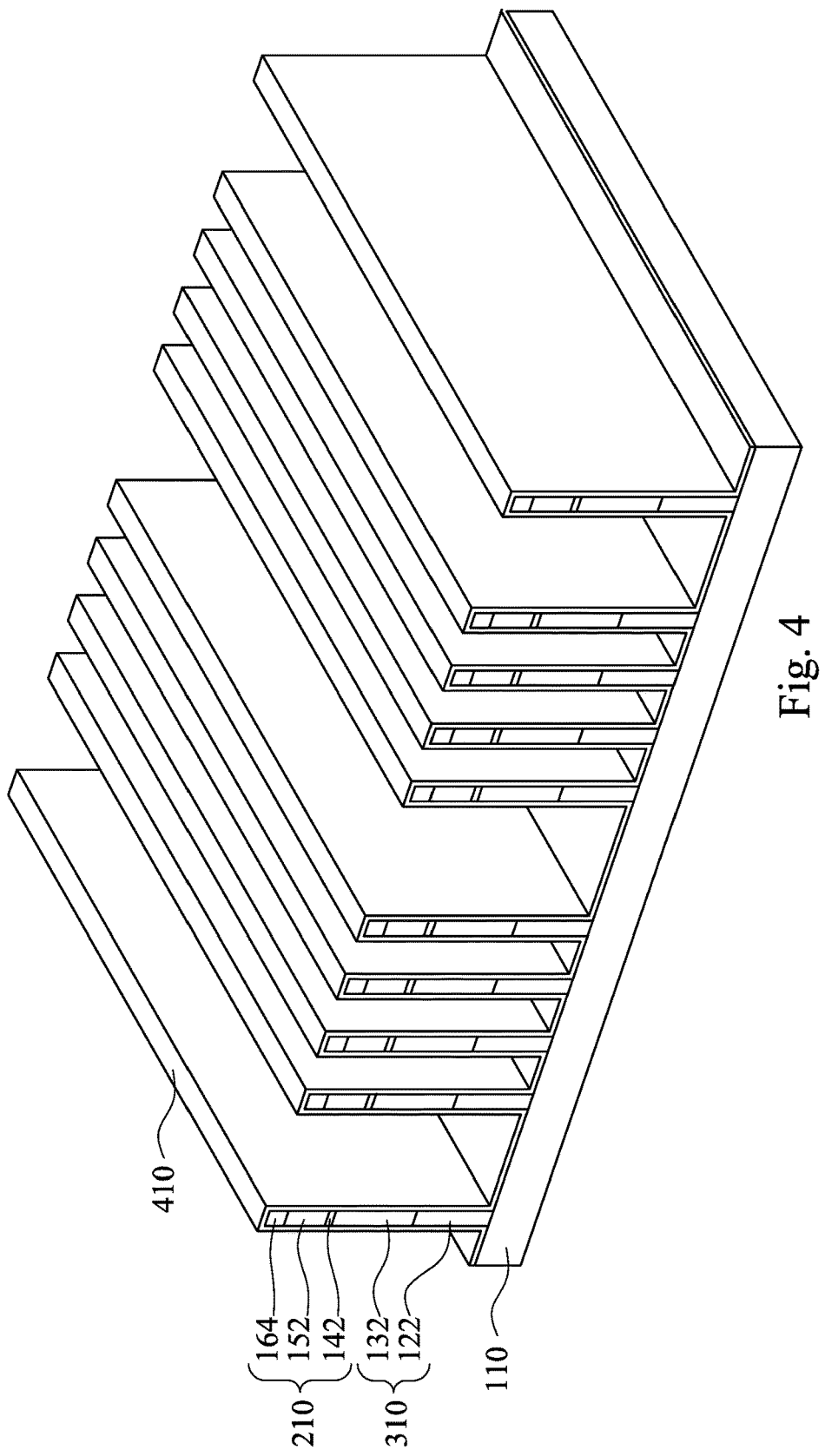

Reference is made to FIG. 4. A dielectric layer 410 is conformally formed over the semiconductor fins 310 and the second mask patterns 210 and fills the trenches 312 (see FIG. 3C). In some embodiments, the dielectric layer 410 may be made of SiOCN, SiCN, SiN, high-k dielectric materials such as $HfO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, or other suitable materials, combinations thereof, or the like. The dielectric layer 410 and the following formed isolation material 610 (see FIG. 6) have etching selectivity. That is, the dielectric layer 410 is not easy to be removed during the recessing process of the isolation material 610 (see FIGS. 7A and 7B). In various examples, the dielectric layer 410 may be deposited by an ALD process, a CVD process, a subatmospheric CVD (SACVD) process, a PVD process, or other suitable process.

Figure 5A:
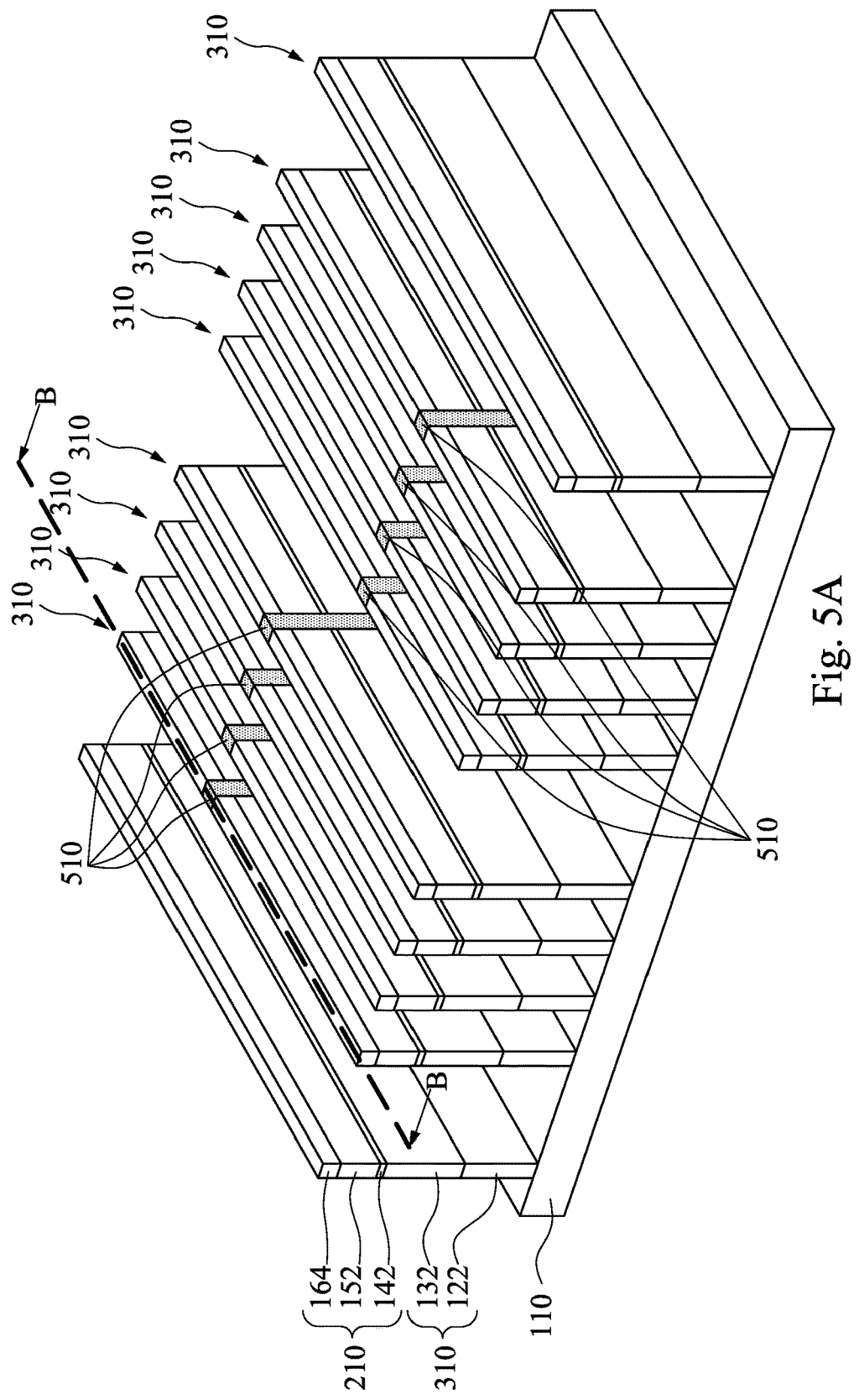
Figure 5B:
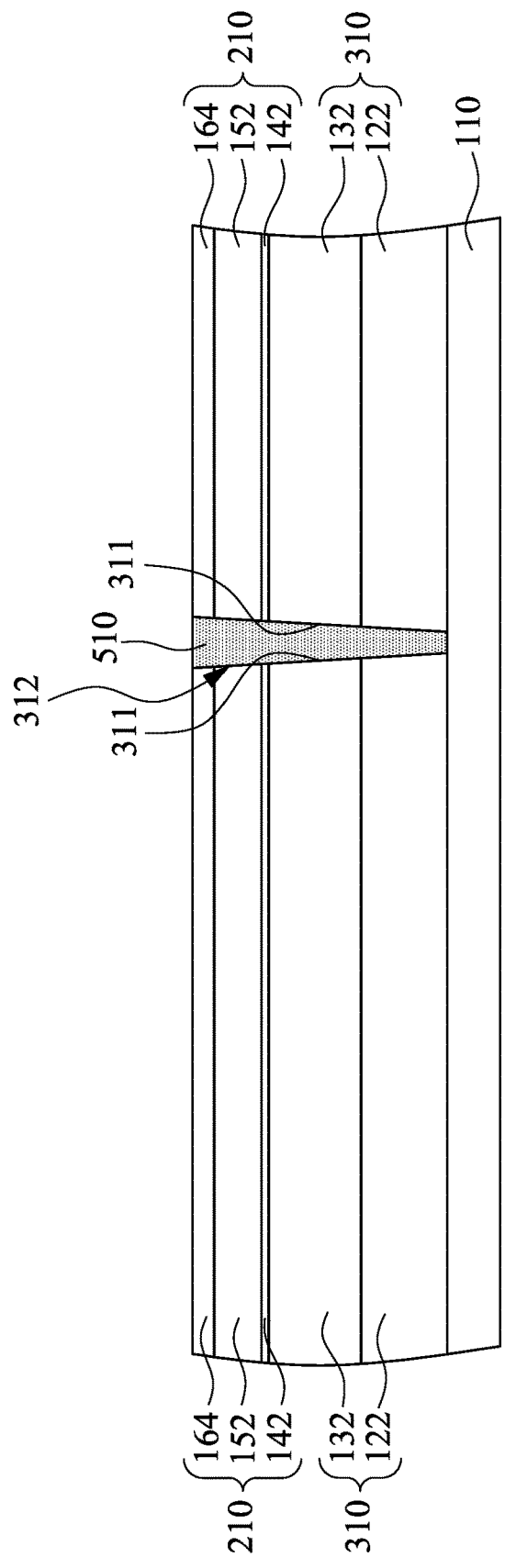
FIG. 5B is a cross-sectional view taken along line B-B of FIG. 5A.

Reference is made to FIGS. 5A and 5B. FIG. 5B is a cross-sectional view taken along line B-B of FIG. 5A. Portions of the dielectric layer 410 (see FIG. 4) outside the trenches 312 are removed. The dielectric layer 410 may be wet etched to remove the portions of the dielectric layer 410. The remaining portions of the dielectric layer 410 form isolation plugs 510 respectively in the trenches 312. In FIG. 5B, the isolation plug 510 fills in the trench 312. As such, the isolation plug 510 is adjacent to and in contact with the ends 311 of the semiconductor fins 310, that is, the ends of the buffer layer 122 and the channel layer 134 of the semiconductor fins 310, and tapers toward the substrate 110. That is, the isolation plug 510 gets narrower toward the substrate 110. Moreover, the isolation plug 510 is in contact with the substrate 110 in some embodiments.

Figure 6:
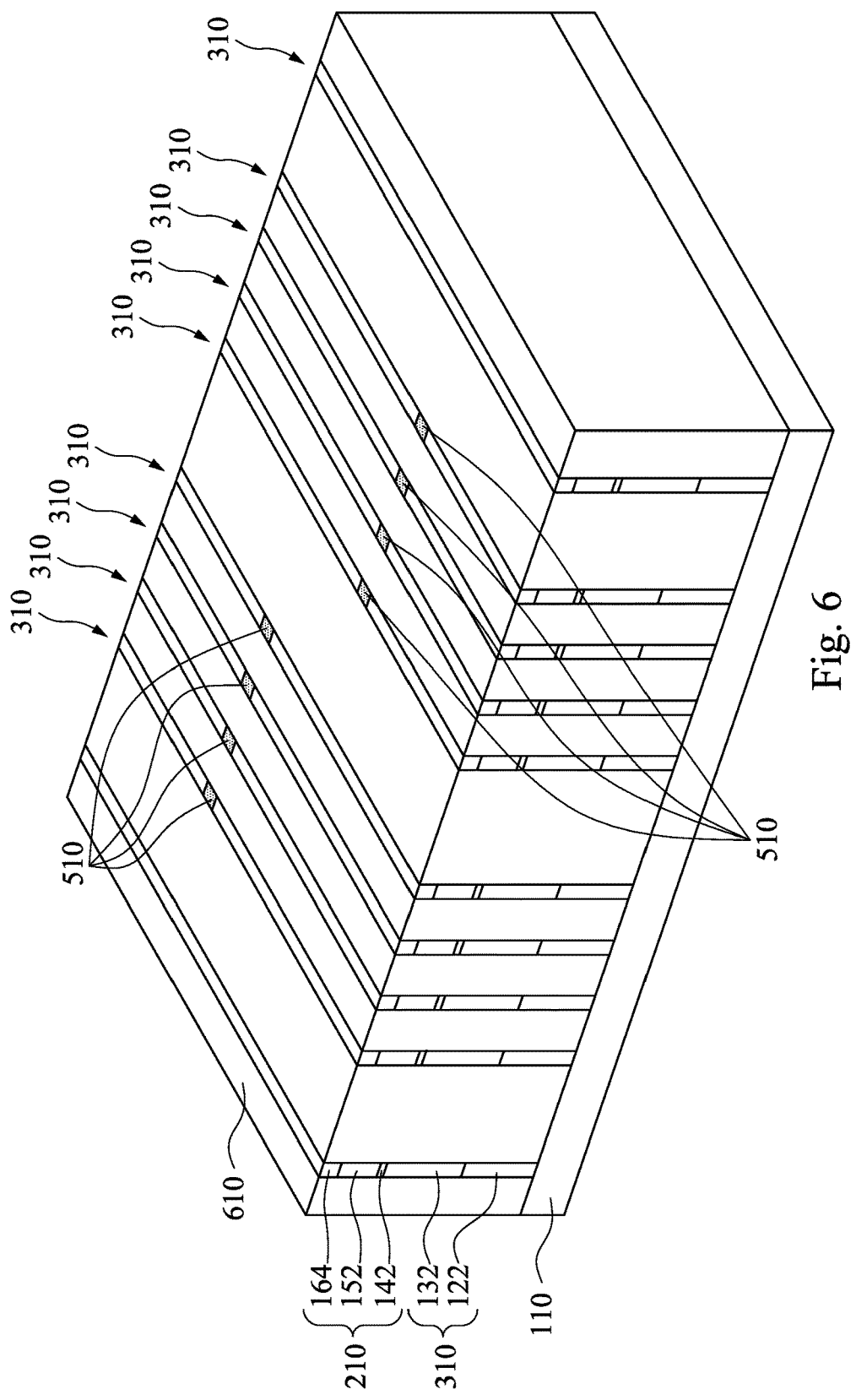

Reference is made to FIG. 6. Isolation material 610 is formed to surround the semiconductor fins 310, the second mask patterns 210, and the isolation plugs 510. The formation of the isolation material 610 may include filling the space around the semiconductor fins 310, the second mask patterns 210, and the isolation plugs 510 with a dielectric material. The isolation material 610 can be formed using, for example, flowable chemical vapor deposition (FCVD), and performing a chemical mechanical polish (CMP) to level the top surface of the dielectric material with the top surface of the second mask patterns 210. Therefore, the second mask patterns 210 and the isolation plugs 510 are exposed from the isolation material 610.

Figure 7A:
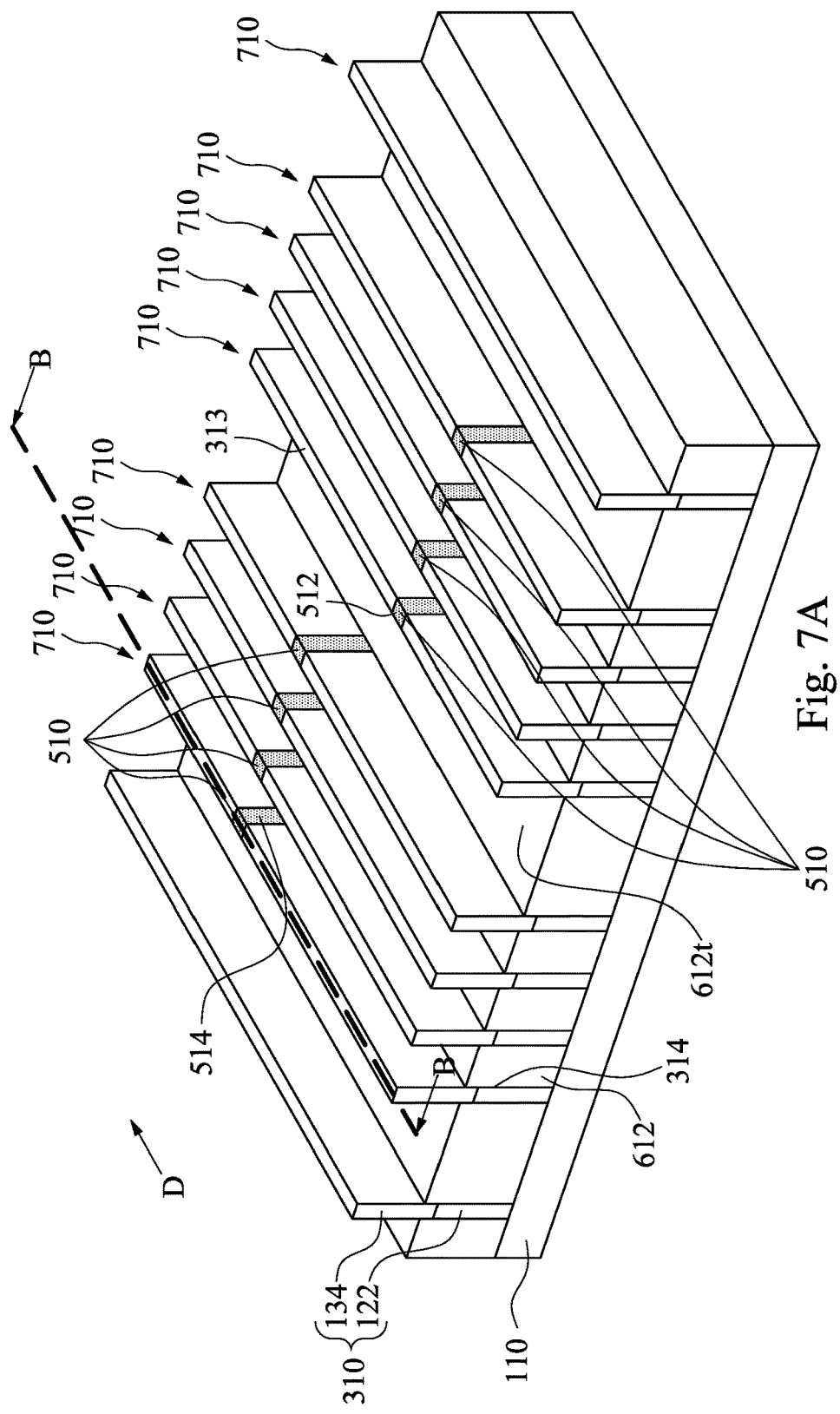
Figure 7B:
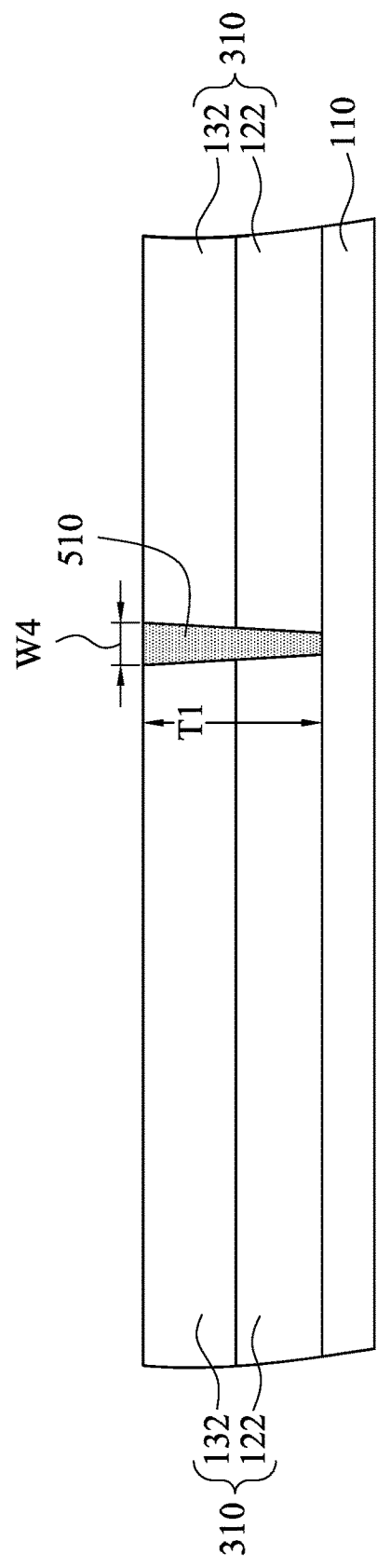
FIG. 7B is a cross-sectional view taken along line B-B of FIG. 7A.

Reference is made to FIGS. 7A and 7B. FIG. 7B is a cross-sectional view taken along line B-B of FIG. 7A. The isolation material 610 of FIG. 6 is recessed to form isolation structures 612 adjacent to and in contact with the semiconductor fins 310 and the isolation plugs 510. The isolation plug 510 is formed between two semiconductor fins that extend and are aligned in a direction D. The second mask patterns 210 of FIG. 6 are removed as well, and upper portions of the isolation plugs 510 are removed, such that the top surfaces 512 of the isolation plugs 510 are substantially flush with the top surfaces 313 of the semiconductor fins 310. In some other embodiments, however, the top surfaces 512 of the isolation plugs 510 are in positions higher than the top surfaces 313 of the semiconductor fins 310. The top surface 612t of the resulting isolation structure 612 is in a position lower than the top surfaces 512 and 313 and may be higher, lower, or level with the interface of the buffer layer 122 and the channel layer 132. Moreover, the resulting isolation structure 612 is adjacent to the sidewall 314 of the semiconductor fin 310 and the sidewall 511 of the isolation plug 510. In some embodiments, the isolation plug 510 has a width W4 in a range of about 8 nm to about 15 nm, and has a thickness T1 in a range of about 80 nm to about 160 nm. If the width W4 is smaller than about 8 nm, the etching of the trench 312 (FIG. 3B) may be failed; if the width W4 is greater than about 15 nm, the isolation plug 510 may be wider than the gate and spacers formed thereon, and epitaxial source/drain may be formed thereon. If the thickness T1 is smaller than about 80 nm, the isolation plug 510 may not isolate the semiconductor fins 310 successfully; if the thickness T1 is greater than about 160 nm, the formation of the isolation plug 510 may have gap filling problem.

Figure 8:
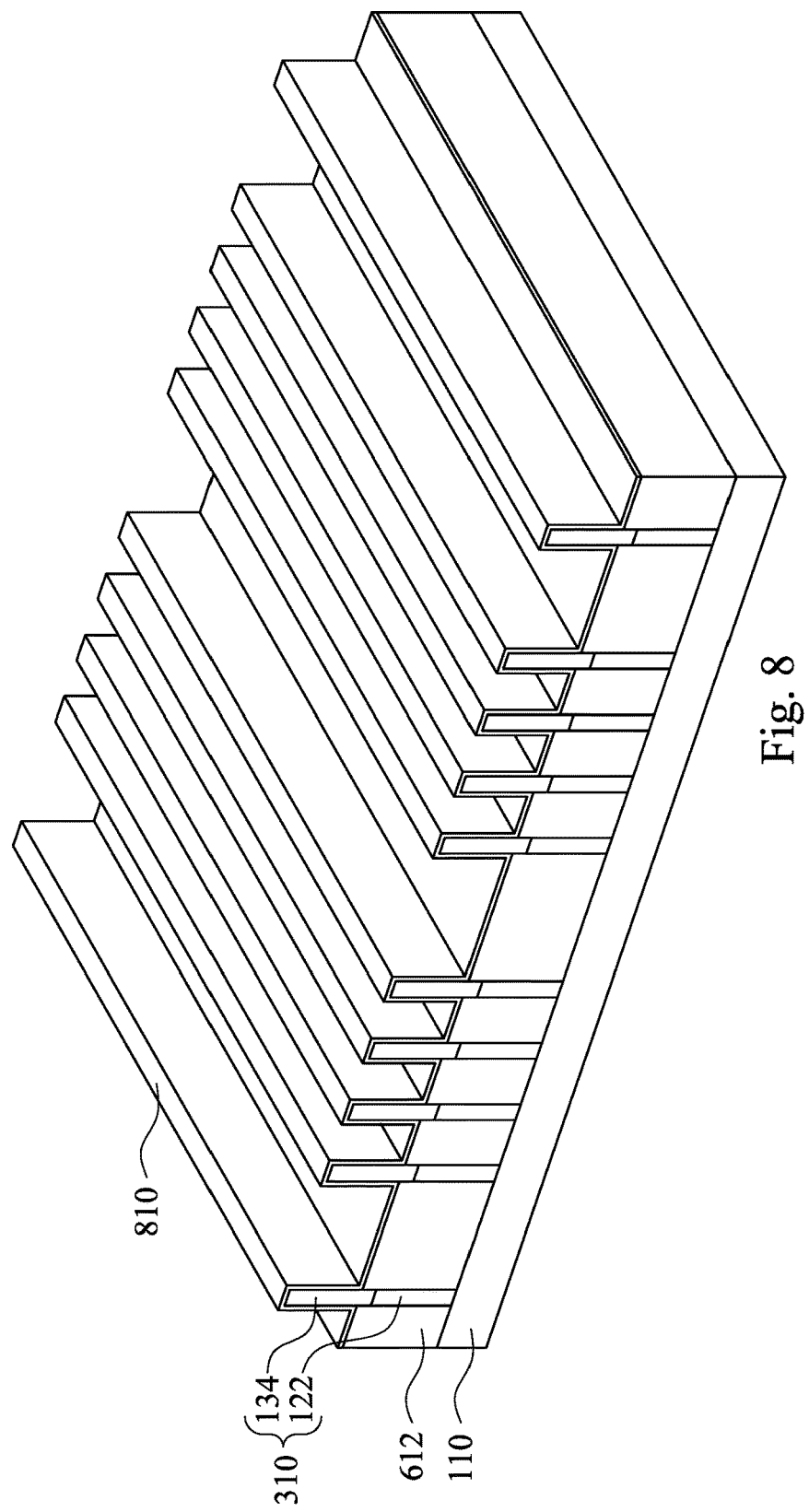

Reference is made to FIG. 8. A dummy dielectric layer 810 is conformally formed to cover the semiconductor fins 310, the isolation plugs 510 (see FIG. 7A), and the isolation structures 612. In some embodiments, the dummy dielectric layer 810 may include silicon dioxide, silicon nitride, a high-κ dielectric material or other suitable material. In various examples, the dummy dielectric layer 810 may be deposited by an ALD process, a CVD process, a subatmospheric CVD (SACVD) process, a flowable CVD process, a PVD process, or other suitable process. By way of example, the dummy dielectric layer 810 may be used to prevent damage to the semiconductor fins 310 by subsequent processing (e.g., subsequent formation of the dummy gate structure).

Figure 9A:
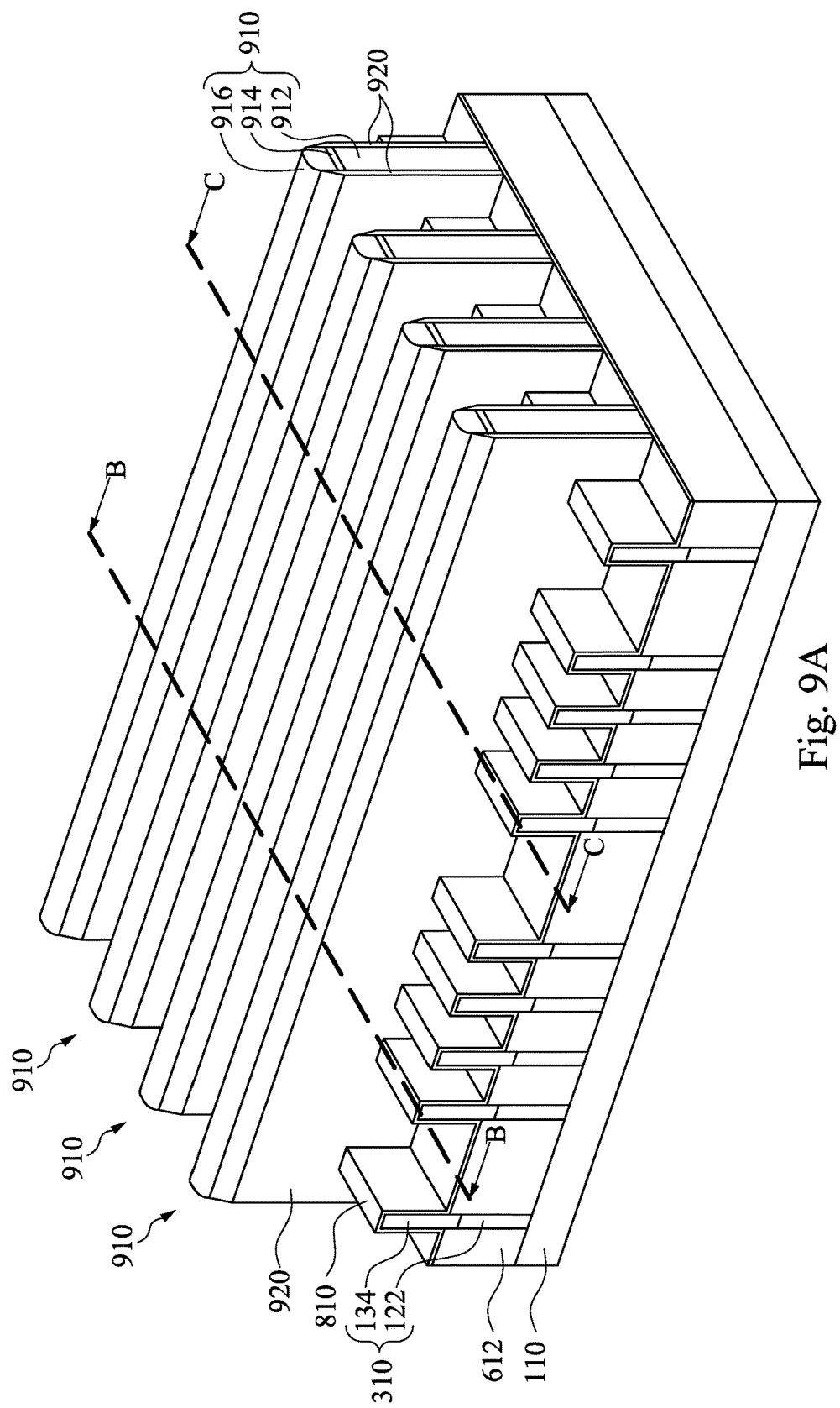
Figure 9B:
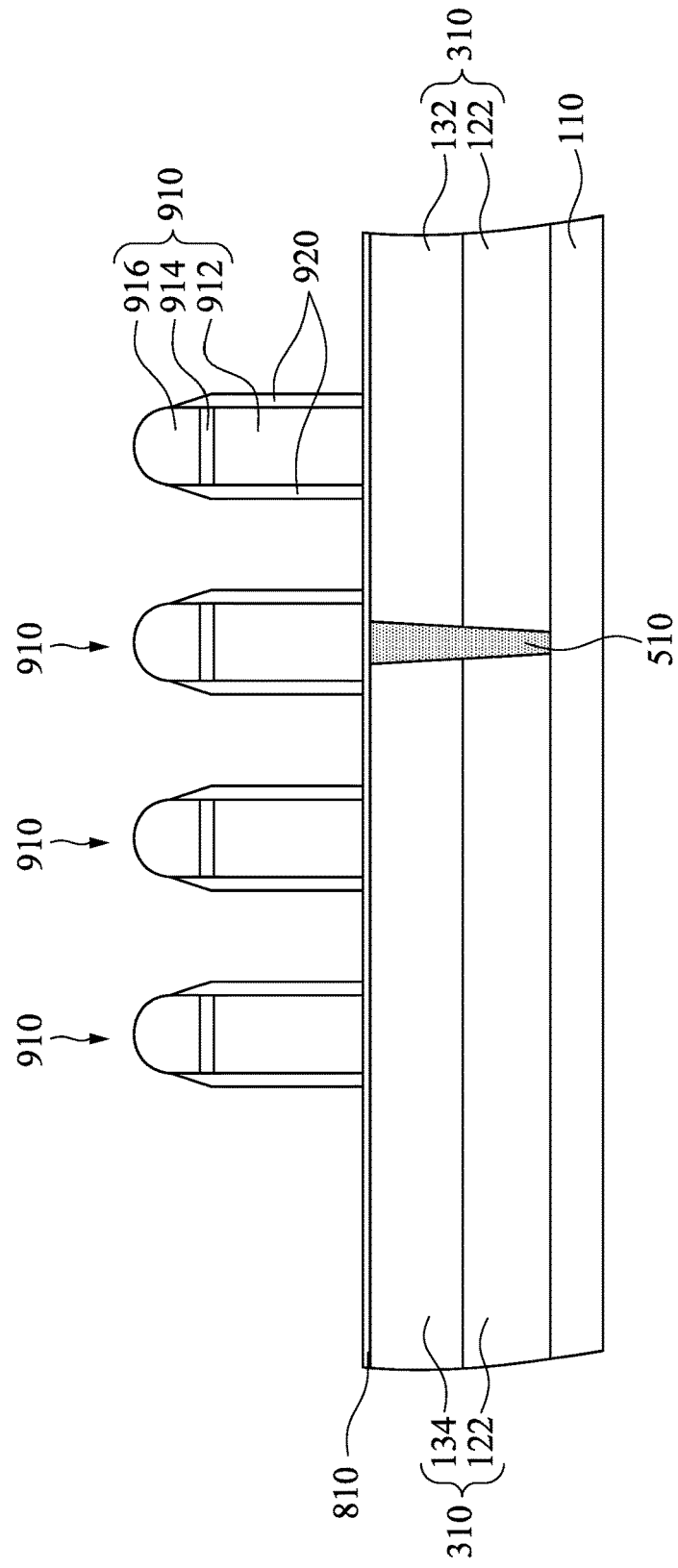
FIG. 9B is a cross-sectional view taken along line B-B of FIG. 9A.
Figure 9C:
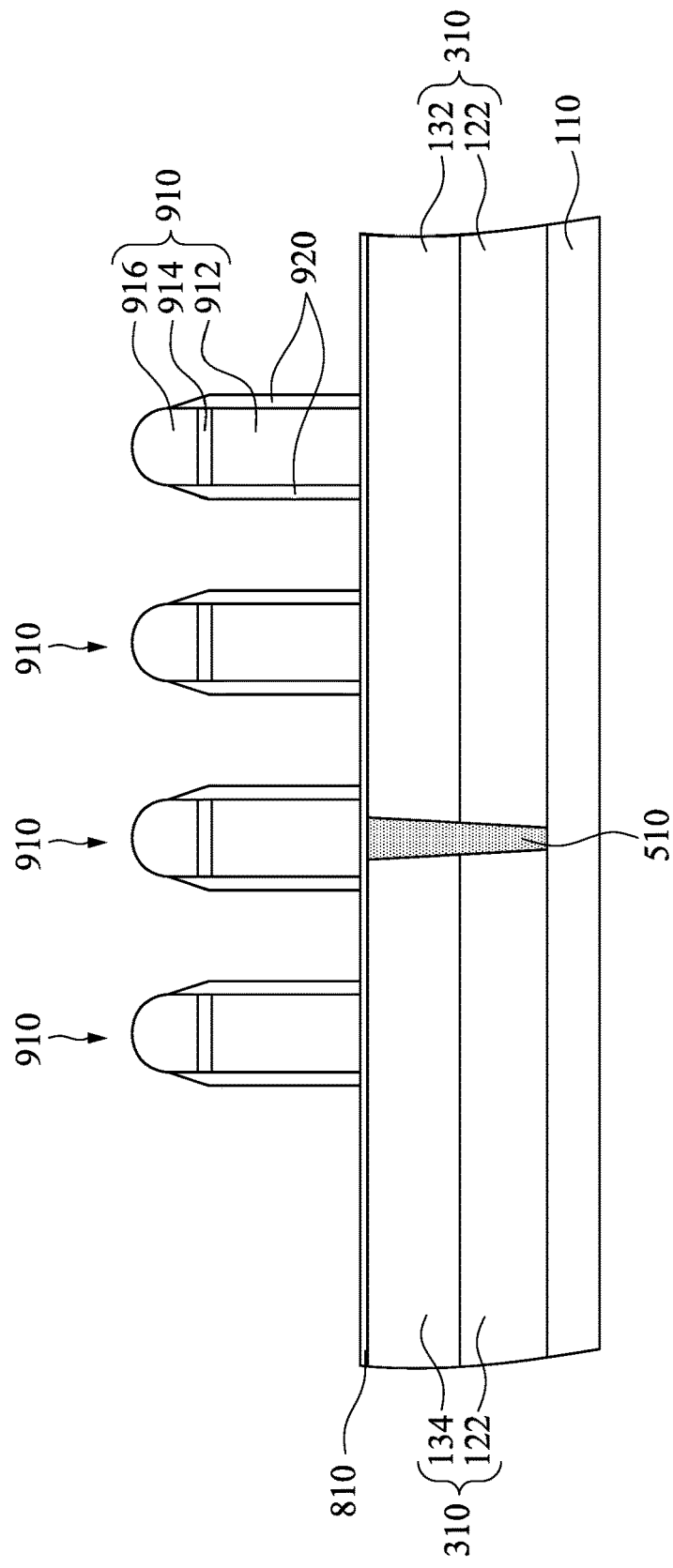
FIG. 9C is a cross-sectional view taken along line C-C of FIG. 9A.

Reference is made to FIG. 9A to 9C. FIG. 9B is a cross-sectional view taken along line B-B of FIG. 9A. FIG. 9C is a cross-sectional view taken along line C-C of FIG. 9A. A plurality of dummy gate stacks 910 are formed over the dummy dielectric layer 810, the semiconductor fins 310, and the isolation structures 612. At least one of the dummy gate stacks 910 covers the isolation plugs 510. For example, the outmost two dummy gate stacks 910 in FIG. 9A do not cover the isolation plugs 510, and the inner two dummy gate stacks 910 in FIG. 9A cover the isolation plugs 510.

The dummy gate stack 910 includes a dummy gate electrode 912, a pad layer 914 formed over the dummy gate electrode 912, and a hard mask layer 916 formed over the pad layer 914. In some embodiments, a dummy gate layer (not shown) may be formed over the dummy dielectric layer 810, the pad layers 914 and the hard mask layers 916 are formed over the dummy gate layer. The dummy gate layer is then patterned using the pad layers 914 and the hard mask layers 916 as masks to form the dummy gate electrode 912. As such, the dummy gate electrode 912, the pad layer 914, and the hard mask layer 916 are referred to as the dummy gate stack 910. In some embodiments, the dummy gate electrode 912 may be made of polycrystalline-silicon (poly-Si), poly-crystalline silicon-germanium (poly-SiGe), or other suitable materials. The pad layer 914 may be made of silicon dioxide or other suitable materials, and the hard mask layer 916 may be made of silicon nitride or other suitable materials.

Spacer structures 920 are at least formed on opposite sides of the dummy gate stacks 910. The spacer structures 920 may include a seal spacer and a main spacer (not shown). The spacer structures 920 include one or more dielectric materials, such as silicon oxide, silicon nitride, silicon oxynitride, SiCN, SiCxOyNz, or combinations thereof. The seal spacers are formed on sidewalls of the dummy gate stacks 910 and the main spacers are formed on the seal spacers. The spacer structures 920 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 920 may include blanket forming spacer layers and then performing etching operations to remove the horizontal portions of the spacer layers. The remaining vertical portions of the spacer layers form the spacer structures 920.

Figure 10:
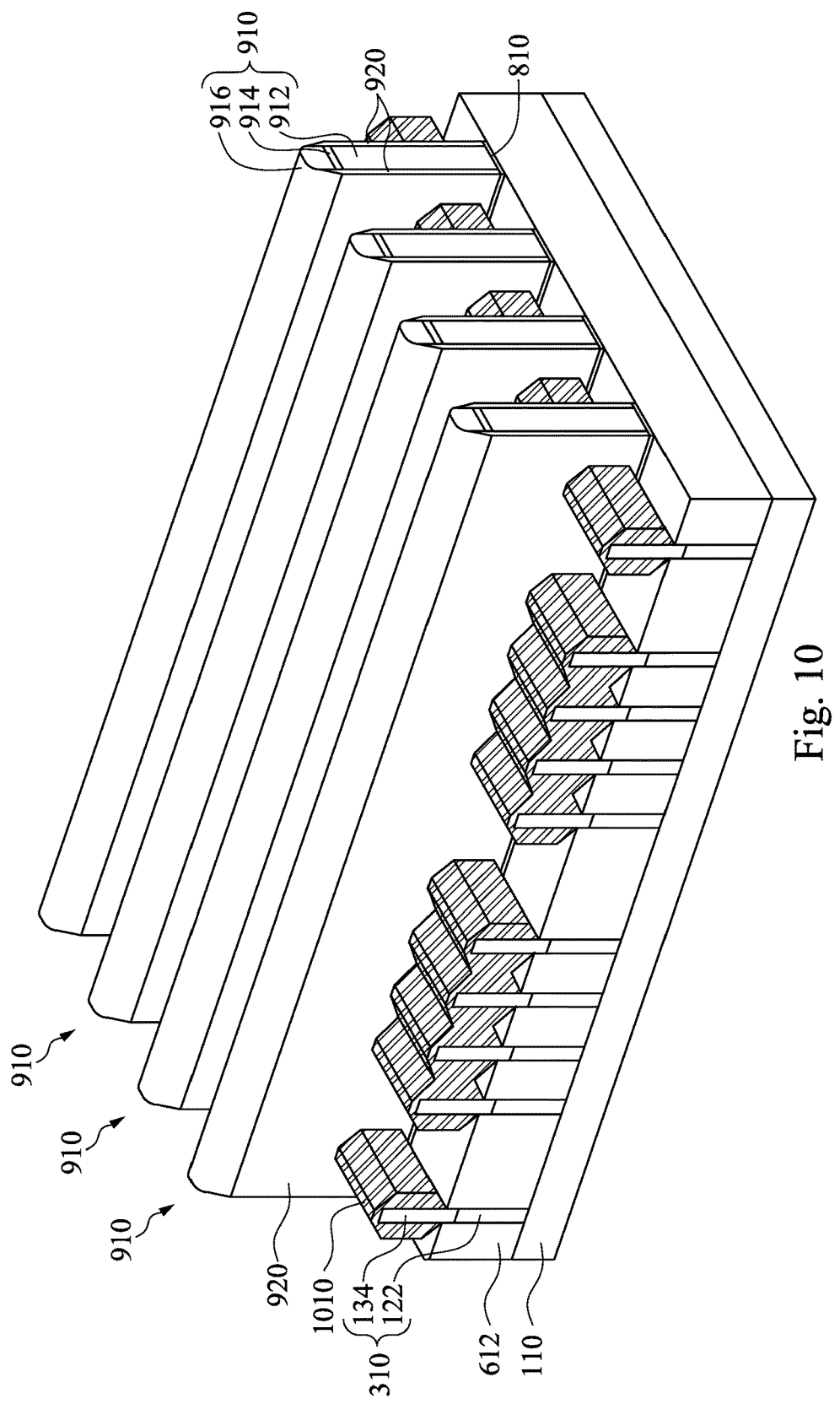

Reference is made to FIG. 10. Portions of the dummy dielectric layer 810 uncovered by the dummy gate stacks 910 and the spacer structures 920 are removed to expose the semiconductor fins 310. Epitaxy structures 1010 are then formed on portions of the semiconductor fins 310 uncovered by the dummy gate stacks 910 and the spacer structures 920 by performing, for example, a selectively growing process. The epitaxy structures 1010 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxy structures 1010 have suitable crystallographic orientations (e.g., a (100), (110), or (111) crystallographic orientation). In some embodiments, the epitaxy structures 1010 include source/drain epitaxial structures. In some embodiments, where an N-type device is desired, the epitaxy structures 1010 may include an epitaxially growing silicon phosphorus (SiP) or silicon carbon (SiC). In some embodiments, where a P-type device is desired, the epitaxy structures 1010 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

Figure 11A:
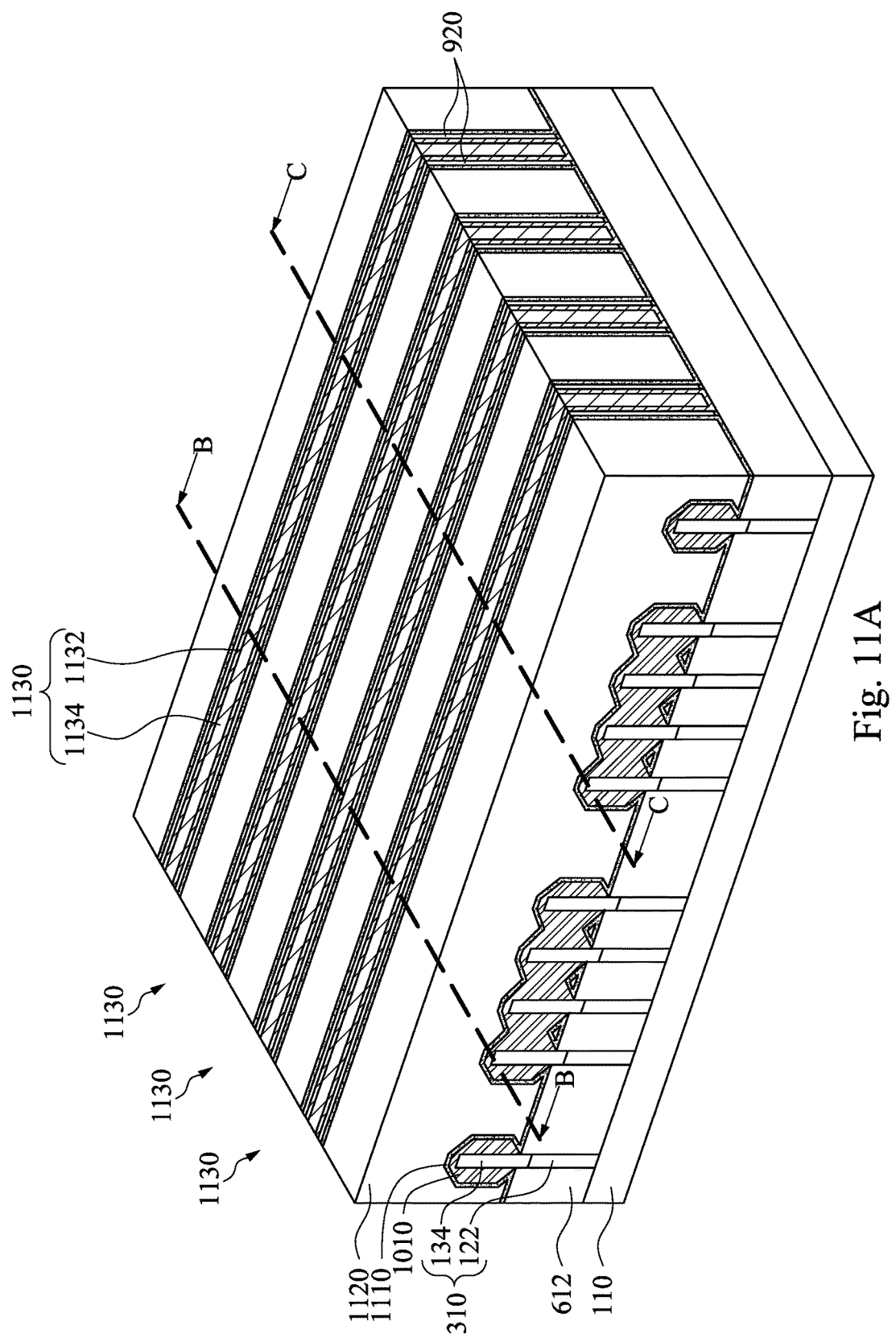
Figure 11B:
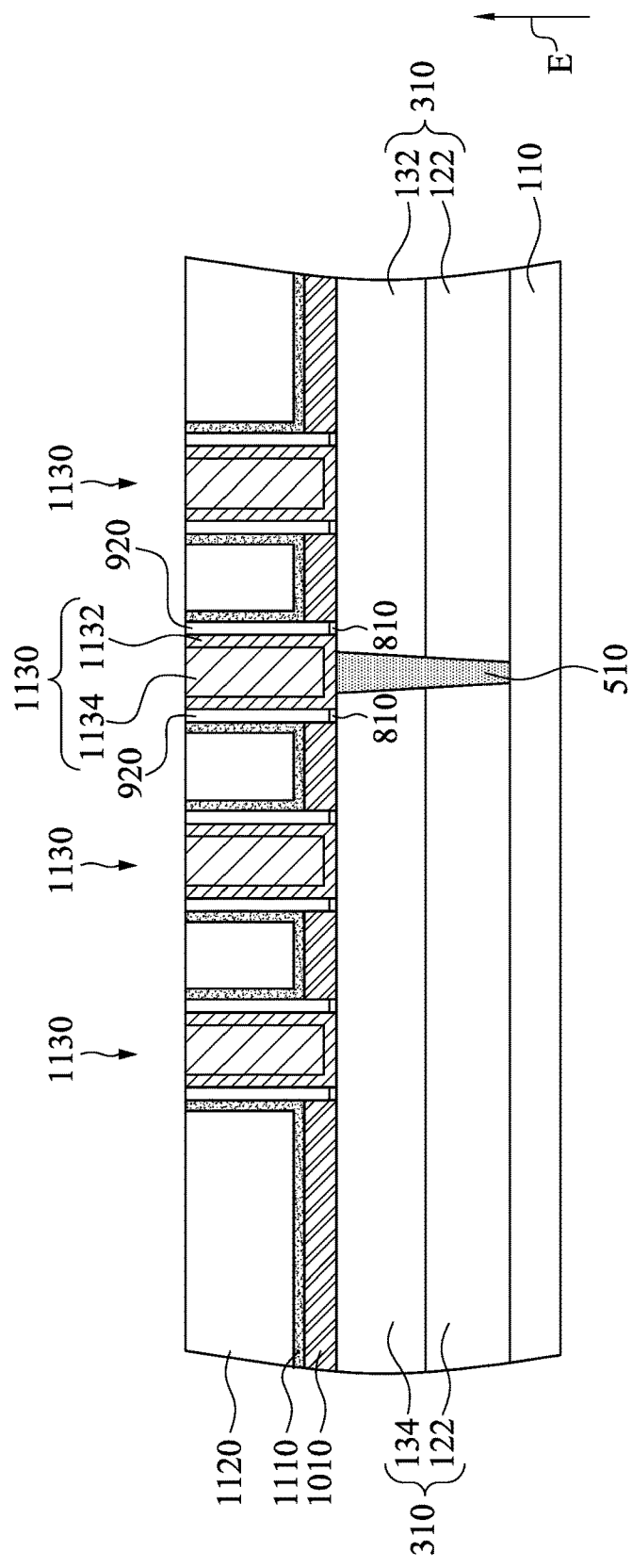
FIG. 11B is a cross-sectional view taken along line B-B of FIG. 11A.
Figure 11C:
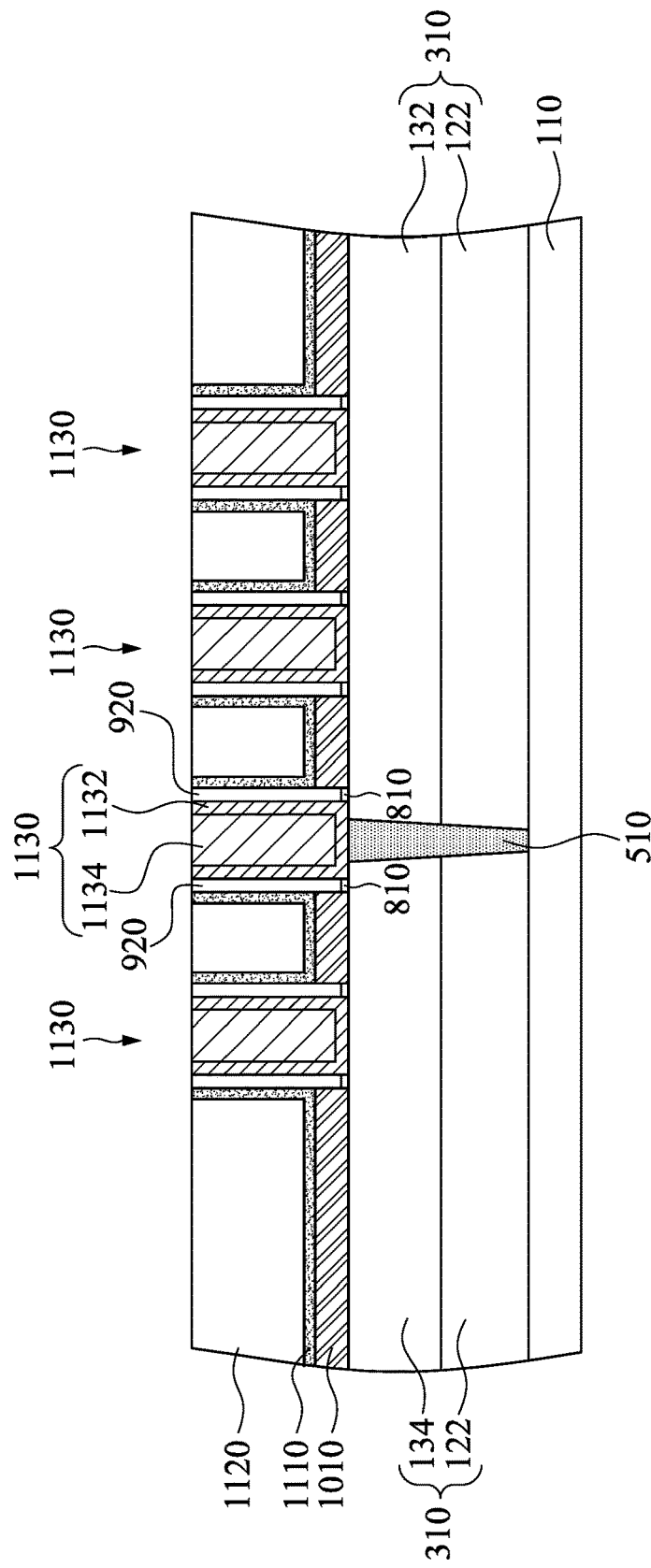
FIG. 11C is a cross-sectional view taken along line C-C of FIG. 11A.

Reference is made to FIGS. 11A to 11C. FIG. 11B is a cross-sectional view taken along line B-B of FIG. 11A. FIG. 11C is a cross-sectional view taken along line C-C of FIG. 11A. A contact etch stop layer (CESL) 1110 is conformally formed over the structure of FIG. 10. In some embodiments, the CESL 1110 can be a stressed layer or layers. In some embodiments, the CESL 1110 has a tensile stress and is formed of $Si_3N_4$. In some other embodiments, the CESL 1110 includes materials such as oxynitrides. In yet some other embodiments, the CESL 1110 may have a composite structure including a plurality of layers, such as a silicon nitride layer overlying a silicon oxide layer. The CESL 1110 can be formed using plasma enhanced CVD (PECVD), however, other suitable methods, such as low pressure CVD (LPCVD), atomic layer deposition (ALD), and the like, can also be used.

An interlayer dielectric (ILD) 1120 is then formed on the CESL 1110. The ILD 1120 may be formed by chemical vapor deposition (CVD), high-density plasma CVD, spin-on, sputtering, or other suitable methods. In some embodiments, the ILD 1120 includes silicon oxide. In some other embodiments, the ILD 1120 may include silicon oxy-nitride, silicon nitride, or a low-k material.

A replacement gate (RPG) process scheme is employed. In the RPG process scheme, a dummy polysilicon gate (the dummy gate electrode 912 (see FIG. 10) in this case) is formed in advance and is replaced later by a metal gate. In some embodiments, the dummy gate stacks 910 are removed to form openings with the spacer structures 920 as their sidewalls. In some other embodiments, the dummy dielectric layers 810 (see FIG. 9A) are removed as well. Some portions of the dummy dielectric layer 810 remain under the spacer structures 920, and at least one of the openings expose the isolation plug 510. Alternatively, in some embodiments, the dummy gate stack 910 is removed while the dummy dielectric layer 810 retains. The dummy gate stack 910 (and the dummy dielectric layer 810) may be removed by dry etch, wet etch, or a combination of dry and wet etch. For example, a wet etch process may include exposure to a hydroxide containing solution (e.g., ammonium hydroxide), deionized water, and/or other suitable etchant solutions.

A gate dielectric layer 1132 is conformally formed in the openings. The gate dielectric layer 1132 is over the semiconductor fins 310 and the isolation plugs 510. The gate dielectric layer 1132 can be a high-κ dielectric layer 1132 having a dielectric constant (κ) higher than the dielectric constant of $SiO_2$, i.e. κ>3.9. The gate dielectric layer 1132 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The gate dielectric layer 1132 is deposited by suitable techniques, such as ALD, CVD, PVD, thermal oxidation, combinations thereof, or other suitable techniques.

At least one metal layer is formed in the openings and on the gate dielectric layer 1132. Subsequently, a chemical mechanical planarization (CMP) process is performed to planarize the metal layer and the gate dielectric layer 1132 to form metal gate stacks 1130 respectively in the openings. At least one of the metal gate stacks 1130 crosses over the semiconductor fins 310 which are separated from the isolation structures 612. At least one of the metal gate stacks 1130 includes the gate dielectric layer 1132 and a metal gate electrode 1134 over the gate dielectric layer 1132. The metal gate electrode 1134 may include work function metal layer(s), capping layer(s), fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate electrode 1134 is a p-type metal gate including a p-type work function metal layer. In some embodiments, the capping layer in the metal gate electrodes 1134 may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer in the metal gate electrodes 1134 may include tungsten (W). The fill layer may be deposited by ALD, PVD, CVD, or other suitable process.

In FIG. 11B, one of the metal gate stacks 1130 is disposed over and is in contact with the isolation plug 510. The metal gate stack 1130 covers the whole top surface of the isolation plug 510. The spacer structures 920 are disposed on opposite sides of the isolation plug 510 and are not in contact with the isolation plug 510. Hence, the metal gate stack 1130 is referred to as being aligned with the isolation plug 510 in an extension direction E of the isolation plug 510.

Figure 12A:
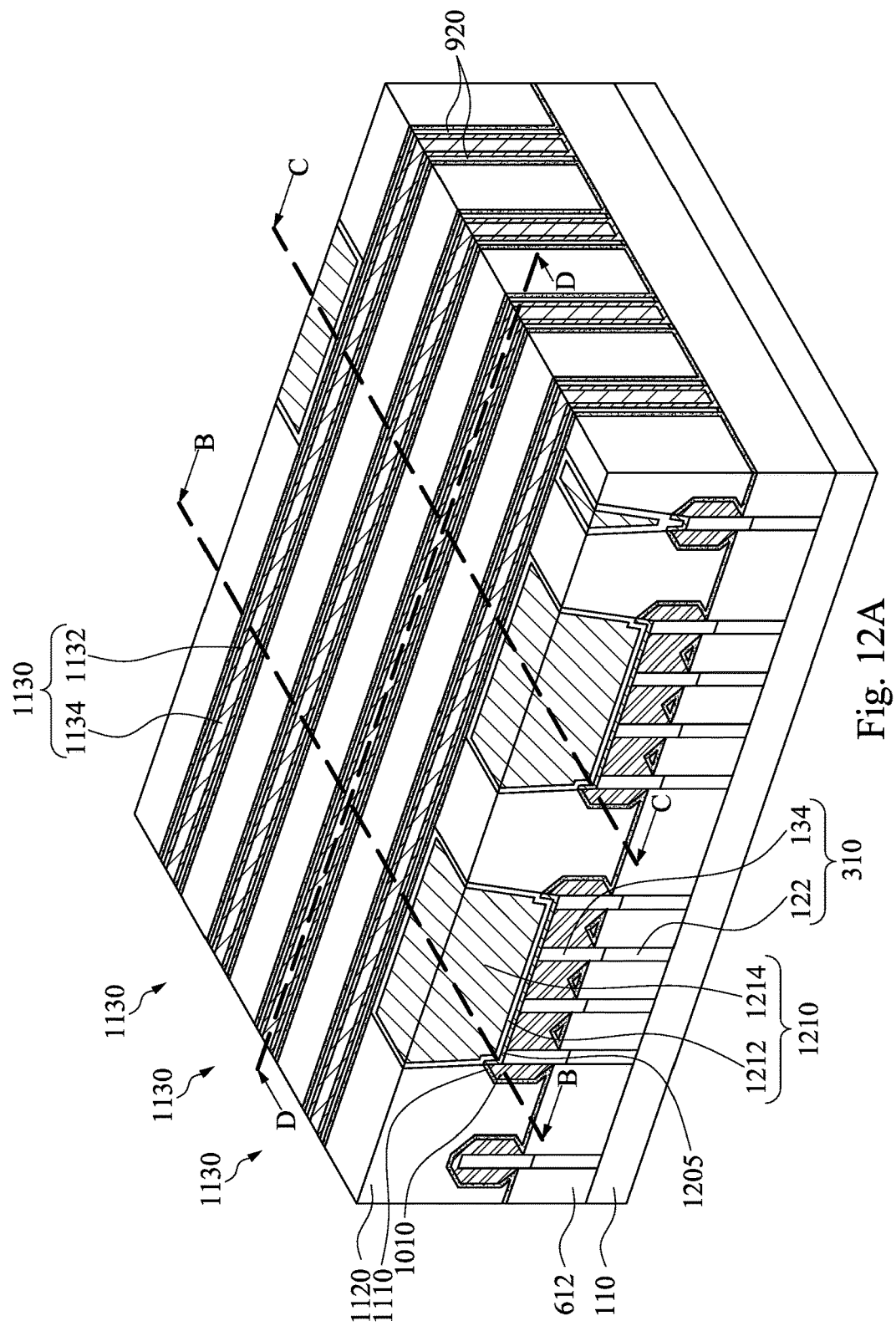
Figure 12B:
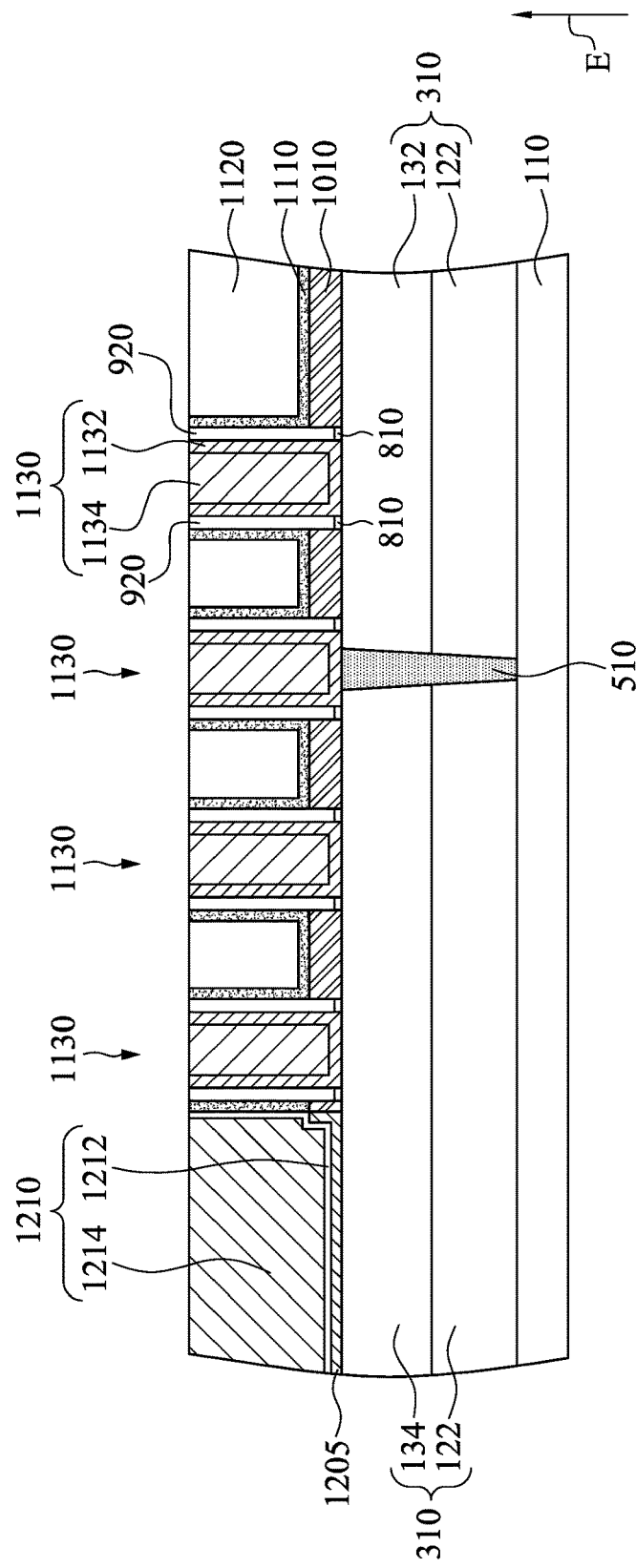
FIG. 12B is a cross-sectional view taken along line B-B of FIG. 12A.
Figure 12C:
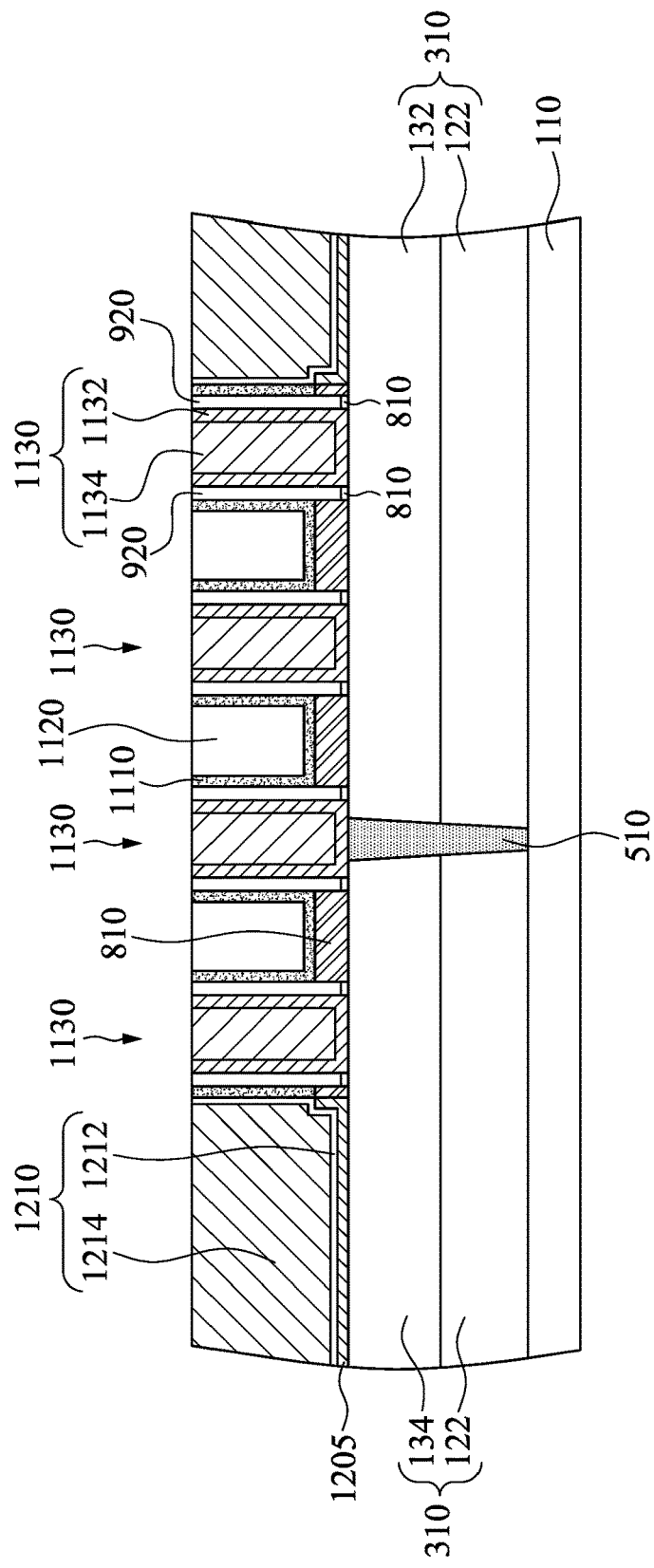
FIG. 12C is a cross-sectional view taken along line C-C of FIG. 12A.
Figure 12D:
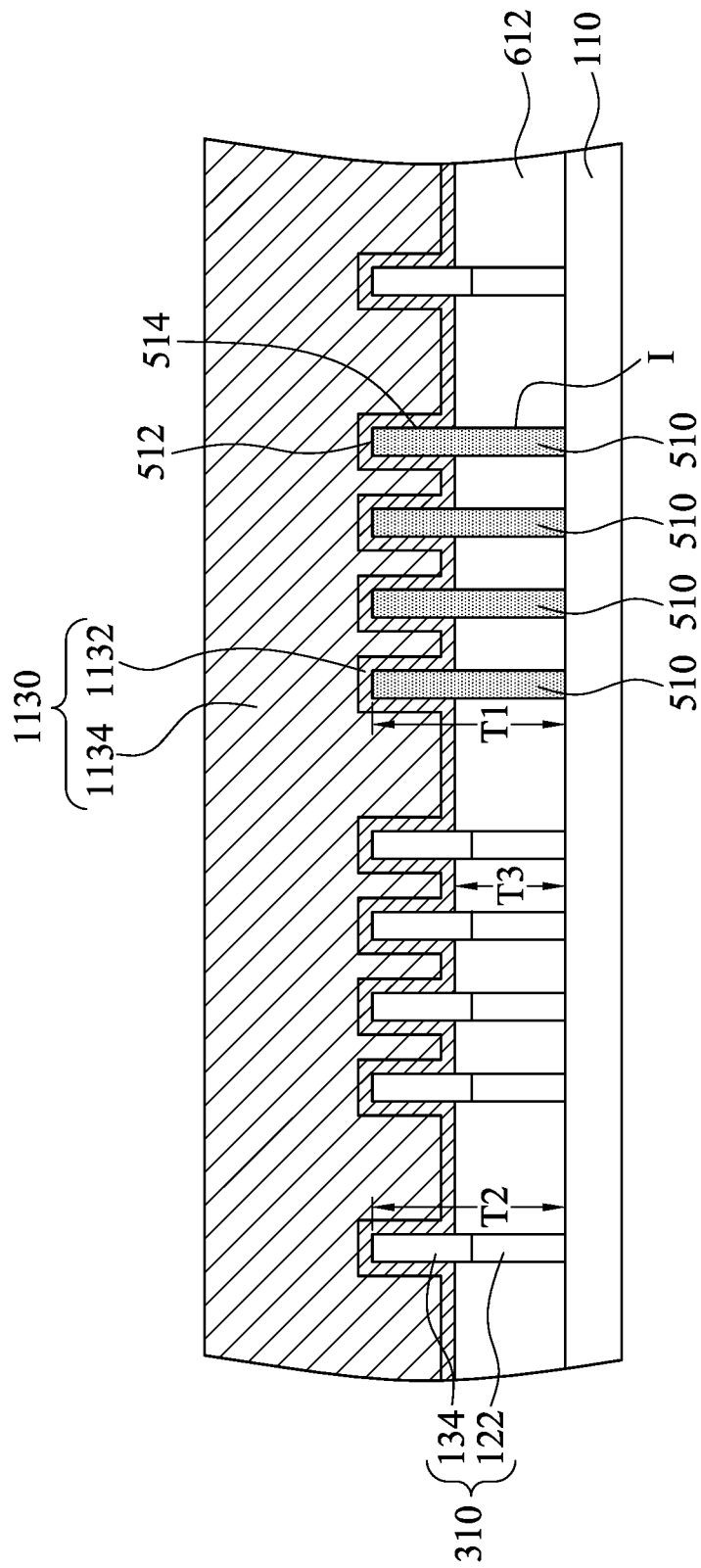
FIG. 12D is a cross-sectional view taken along line D-D of FIG. 12A.

Reference is made to FIGS. 12A to 12D. FIG. 12B is a cross-sectional view taken along line B-B of FIG. 12A. FIG. 12C is a cross-sectional view taken along line C-C of FIG. 12A. FIG. 12D is a cross-sectional view taken along line D-D of FIG. 12A. The ILD 1120 and the CESL 1110 are etched to form a plurality of openings by various methods, including a dry etch, a wet etch, or a combination of dry etch and wet etch. The openings extend through the ILD 1120 and the CESL 1110 and expose the epitaxy structures 1010 and the semiconductor fins 310.

Cap layers 1205, which may be silicide layers, are formed in the openings and over the exposed epitaxy structures 1010 and semiconductor fins 310 by a self-aligned silicide (salicide) process. The silicide process converts the surface portions of the epitaxy structures 1010 and the semiconductor fins 310 into the silicide contacts. Silicide processing involves deposition of a metal that undergoes a silicidation reaction with silicon (Si). In order to form silicide contacts on the epitaxy structures 1010 and the semiconductor fins 310, a metal material is blanket deposited on the epitaxy structures 1010 and the semiconductor fins 310. After heating the wafer to a temperature at which the metal reacts with the silicon of the epitaxy structures 1010 and the semiconductor fins 310 to form contacts, unreacted metal is removed. The silicide contacts remain over the epitaxy structures 1010 and the semiconductor fins 310, while unreacted metal is removed from other areas. The silicide layer may include a material selected from titanium silicide, cobalt silicide, nickel silicide, platinum silicide, erbium silicide, palladium silicide, combinations thereof, or other suitable materials.

In some embodiments, a barrier layer 1212 is formed on the cap layer 1205 and in the openings. The barrier layer 1212 can improve the adhesion between the cap layer 1205 and a material formed thereon (such as the filling material 1214). The barrier layer 1212 may include metal nitride materials. For example, the barrier layer 1212 includes Ti, TiN, or combination thereof. In some embodiments, the barrier layer 1212 includes a single layer or multiple layers. For a multiple-layer configuration, the layers include different compositions of metal nitride from each other. For example, the barrier layer 1212 has a first metal nitride layer including Ti and a second metal nitride layer including TiN.

Filling materials 1214 are formed in the openings and over the barrier layer 1212. The filling materials 1214 are electrically connected to the epitaxy structures 150 and the semiconductor fins 310. In some embodiments, metal materials can be filled in the openings, and excessive portions of the metal materials and the barrier layer are removed by performing a CMP process to form the filling materials 1214 and the barrier layer 1212. The filling materials 1214 can be made of tungsten, aluminum, copper, or other suitable materials. The filling materials 1214 and the barrier layer 1212 are referred to as contacts 1210.

In FIG. 12D, the metal gate stack 1130 is in contact with the top surfaces 512 and sidewalls 514 of the isolation plugs 510. Specifically, the gate dielectric layer 1132 is conformally formed on the isolation plugs 510 and the semiconductor fins 310 and thus the gate dielectric layer 1132 is in contact with the top surfaces 512 and sidewalls 514 of the isolation plugs 510. Furthermore, since the isolation plugs 510 and the isolation structure 612 are formed separately, distinguishable interfaces I are formed between the isolation plugs 510 and the isolation structure 612. Moreover, the thickness T1 of the isolation plugs 510 and the thickness T2 of the semiconductor fins 310 are substantially the same. The thickness T3 of the isolation structure 612 is less than the thickness T1 of the isolation plug 510 and the thickness T2 of the semiconductor fin 310.

According to the embodiments, the lattice constant of the buffer layer is similar to or substantially the same as the lattice constant of the substrate, and thus the defect issue on the top surface of the buffer layer can be improved. Moreover, the isolation plug is formed in the buffer layer to modify the lattice constant of the buffer layer, and thus the lattice constant of the channel layer disposed on the buffer layer is also modified. The strain of the channel layer is therefore enhanced, and the performance of the semiconductor device is also improved. This configuration can be applied to an N-type semiconductor device, such as an N-type MOS transistor, but the present disclosure is not limited in this respect.

Figure 13:
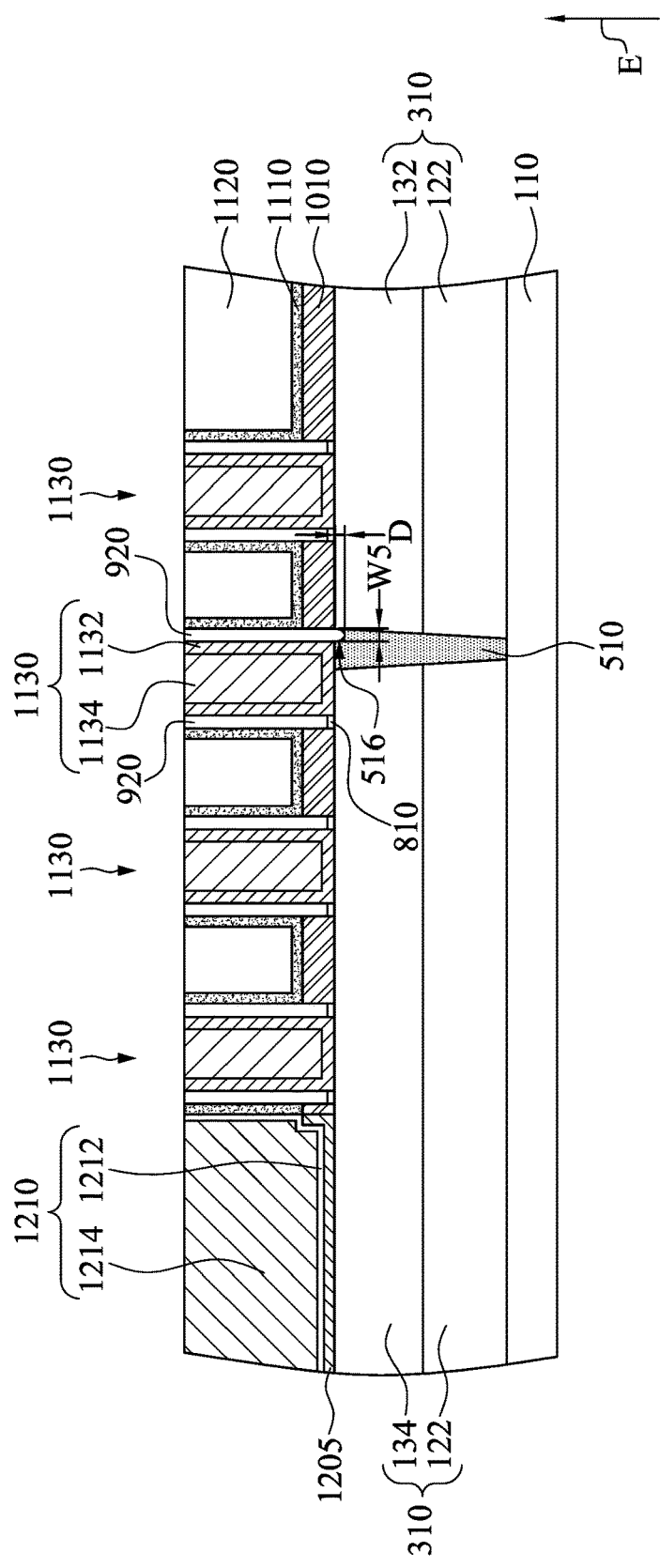
FIG. 13 is a cross-sectional view of a semiconductor device in accordance with some embodiments of the present disclosure.

FIG. 13 is a cross-sectional view of a semiconductor device in accordance with some embodiments of the present disclosure. FIG. 13 is taken along the same line as FIG. 12B. The difference between the semiconductor devices of FIGS. 13 and 12B pertains to the position of the isolation plug 510. In FIG. 12B, the isolation plug 510 is aligned with the metal gate stack 1130 in the extension direction E of the isolation plug 510. In FIG. 13, however, the isolation plug 510 is partially misaligned with the metal gate stack 1130 in the extension direction E. That is, the isolation plug 510 is partially offset from the metal gate stack 1130 in the extension direction E. A portion of the isolation plug 510 is under the metal gate stack 1130, and thus is aligned with the metal gate stack 1130 in the extension direction E, and another portion of the isolation plug 510 is under the spacer structure 920, and thus is misaligned with the metal gate stack 1130 in the extension direction E and is aligned with the spacer structure 920 in the extension direction E. The metal gate stack 1130 covers a portion of the top surface of the isolation plug 510. The misaligned configuration is created from the process of patterning the dummy gate stacks 910 (see FIG. 9B). Reference is made to FIGS. 9B and 13. Specifically, in the case of FIG. 13, the isolation plug 510 is partially misaligned with the hard mask layer 916 during the dummy gate patterning process. As such, when the dummy gate layer is patterned, the dummy gate stack 910 is misaligned with the isolation plug 510. During the patterning process, a portion of the dummy dielectric layer 810 over the isolation plug 510 may be removed, such that the isolation plug 510 is exposed from the dummy dielectric layer 810. The isolation plug 510 may be then etched in this patterning process, and a recess 516 is formed in the isolation plug 510. The recess 516 may have a curved bottom surface, and the recess 516 has a depth D in a range from about 3 nm to about 10 nm and a width W5 in a range from about 3 nm to about 6 nm. The spacer structure 920 may be filled in the recess 516 and thus is in contact with the isolation plug 510. If the dimension of the recess 516 is out of the aforementioned range, the spacer structure 920 may not fill the recess 516, and void(s) may be formed between the spacer structure 920 and the isolation plug 510 to degrade the performance of the semiconductor device. Moreover, the epitaxy structure 1010 may be in contact with the isolation plug 510 in some embodiments. Other relevant structural details of the semiconductor device of FIG. 13 are similar to the semiconductor device of FIG. 12B, and, therefore, a description in this regard will not be repeated hereinafter.

According to some embodiments, a semiconductor device includes a substrate, a semiconductor fin, an isolation plug, and an isolation structure. The semiconductor fin is over the substrate. The isolation plug is over the substrate and adjacent to an end of the semiconductor fin. The isolation structure is over the substrate and adjacent to sidewalls of the semiconductor fin and the isolation plug. A top surface of the isolation structure is in a position lower than a top surface of the isolation plug.

In some embodiments, the isolation plug tapers toward the substrate.

In some embodiments, the semiconductor fin includes a buffer layer and a channel layer. The buffer layer is over the substrate. The channel layer is over the buffer layer. A lattice constant of the buffer layer is greater than a lattice constant of the channel layer.

In some embodiments, the semiconductor device further includes a gate electrode covering the isolation plug.

In some embodiments, the semiconductor device further includes a gate dielectric layer between the gate electrode and the isolation plug.

In some embodiments, the gate dielectric layer is in contact with the sidewall of the isolation plug.

In some embodiments, the isolation plug is aligned with the gate electrode in an extension direction of the isolation plug.

In some embodiments, the isolation plug is partially misaligned with the gate electrode in an extension direction of the isolation plug.

According to some embodiments, a semiconductor device includes a substrate, a first semiconductor fin, a second semiconductor fin, an isolation plug, an isolation structure, and a gate electrode. The first and second semiconductor fins are over the substrate. An end of the first semiconductor fin opposes an end of the second semiconductor fin. The isolation plug is between the ends of the first and second semiconductor fins. The isolation structure surrounds the first and second semiconductor fins and the isolation plug. The gate electrode is over the isolation plug.

In some embodiments, the isolation plug gets narrower toward the substrate.

In some embodiments, a top surface of the isolation plug is in a position higher than a top surface of the isolation structure.

In some embodiments, the isolation plug and the isolation structure have a distinguishable interface.

In some embodiments, the semiconductor device further includes a third semiconductor fin over the substrate and spaced apart from the isolation plug by a portion of the isolation structure. The gate electrode crosses over the third semiconductor fin.

In some embodiments, the semiconductor device further includes a gate dielectric layer conformally over the third semiconductor fin, the portion of the isolation structure, and the isolation plug.

According to some embodiments, a method for manufacturing a semiconductor device includes forming first and second semiconductor fins over a substrate. Ends of the first and second semiconductor fins are opposite each other. An isolation plug is formed between the ends of the first and second semiconductor fins. An isolation structure is formed surrounding the first and second semiconductor fins and the isolation plug. A gate electrode is formed over the isolation plug.

In some embodiments, forming the isolation plug includes forming a dielectric layer to cover the first and second semiconductor fins and to fill a space between the ends of the first and second semiconductor fins. An excess portion of the dielectric layer outside the space is removed to form the isolation plug.

In some embodiments, forming the isolation structure includes forming an isolation material over the first and second semiconductor fins and the isolation plug. The isolation material is recessed to form the isolation structure. The isolation material is recessed such that a top surface of the isolation structure is lower than a top surface of the isolation plug.

In some embodiments, forming the first and second semiconductor fins includes forming a buffer layer over the substrate. A channel layer is formed over the buffer layer. The buffer layer and the channel layer are etched to form the first and second semiconductor fins.

In some embodiments, the method further includes forming a gate dielectric layer conformally over the isolation plug.

In some embodiments, the isolation plug includes SiOCN, SiCN, or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a substrate;
    a semiconductor fin over the substrate;
    an isolation plug over the substrate and adjacent to an end of the semiconductor fin;
    an isolation structure over the substrate and adjacent to sidewalls of the semiconductor fin and the isolation plug, wherein a top surface of the isolation structure is in a position lower than a top surface of the isolation plug; and
    a gate dielectric layer over the isolation plug, wherein the gate dielectric layer is in contact with the sidewall of the isolation plug.

2. The semiconductor device of claim 1, wherein the isolation plug tapers toward the substrate.

3. The semiconductor device of claim 1, wherein the semiconductor fin comprises:
    a buffer layer over the substrate; and
    a channel layer over the buffer layer, wherein a lattice constant of the buffer layer is greater than a lattice constant of the channel layer.

4. The semiconductor device of claim 1, further comprising a gate electrode covering the isolation plug.

5. The semiconductor device of claim 4, wherein the gate dielectric layer is between the gate electrode and the isolation plug.

6. The semiconductor device of claim 4, wherein the isolation plug is aligned with the gate electrode in an extension direction of the isolation plug.

7. The semiconductor device of claim 4, wherein the isolation plug is partially misaligned with the gate electrode in an extension direction of the isolation plug.

8. A semiconductor device comprising:
    a substrate;
    a first semiconductor fin and a second semiconductor fin over the substrate, wherein an end of the first semiconductor fin opposes an end of the second semiconductor fin;
    an isolation plug between the ends of the first and second semiconductor fins, wherein the isolation plug gets narrower toward the substrate;
    an isolation structure surrounding the first and second semiconductor fins and the isolation plug; and
    a gate electrode over the isolation plug.

9. The semiconductor device of claim 8, wherein a top surface of the isolation plug is in a position higher than a top surface of the isolation structure.

10. The semiconductor device of claim 8, wherein the isolation plug and the isolation structure have a distinguishable interface.

11. The semiconductor device of claim 8, further comprising:
    a third semiconductor fin over the substrate and spaced apart from the isolation plug by a portion of the isolation structure, wherein the gate electrode crosses over the third semiconductor fin.

12. The semiconductor device of claim 11, further comprising:
    a gate dielectric layer conformally over the third semiconductor fin, the portion of the isolation structure, and the isolation plug.

13. A method for manufacturing a semiconductor device comprising:
    forming first and second semiconductor fins over a substrate, wherein ends of the first and second semiconductor fins are opposite each other;
    forming an isolation plug between the ends of the first and second semiconductor fins;
    forming an isolation structure surrounding the first and second semiconductor fins and the isolation plug after forming the isolation plug; and
    forming a gate electrode over the isolation plug.

14. The method of claim 13, wherein forming the isolation plug comprises:
    forming a dielectric layer to cover the first and second semiconductor fins and to fill a space between the ends of the first and second semiconductor fins; and
    removing an excess portion of the dielectric layer outside the space to form the isolation plug.

15. The method of claim 13, wherein forming the isolation structure comprises:
    forming an isolation material over the first and second semiconductor fins and the isolation plug; and
    recessing the isolation material to form the isolation structure, wherein the isolation material is recessed such that a top surface of the isolation structure is lower than a top surface of the isolation plug.

16. The method of claim 13, wherein forming the first and second semiconductor fins comprises:
    forming a buffer layer over the substrate;
    forming a channel layer over the buffer layer; and
    etching the buffer layer and the channel layer to form the first and second semiconductor fins.

17. The method of claim 13, further comprising:
    forming a gate dielectric layer conformally over the isolation plug.

18. The method of claim 13, wherein the isolation plug comprises SiOCN, SiCN, or combinations thereof.

19. The method of claim 17, wherein the gate electrode crosses the isolation plug.

20. The method of claim 13, further comprising forming a gate spacer over a sidewall of the gate electrode such that a bottom surface of the gate spacer is in contact with the isolation plug.

* * * * *